(12) United States Patent
Kim et al.

(10) Patent No.: US 12,477,728 B2
(45) Date of Patent: Nov. 18, 2025

(54) SEMICONDUCTOR MEMORY DEVICE AND METHOD OF MANUFACTURE

(71) Applicant: SAMSUNG ELECTRONICS CO., LTD., Suwon-si (KR)

(72) Inventors: Keunnam Kim, Suwon-si (KR); Kiseok Lee, Suwon-si (KR); Byeongjoo Ku, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 348 days.

(21) Appl. No.: 17/994,175

(22) Filed: Nov. 25, 2022

(65) Prior Publication Data

US 2023/0389310 A1 Nov. 30, 2023

(30) Foreign Application Priority Data

May 27, 2022 (KR) ........................ 10-2022-0065503

(51) Int. Cl.
*H10B 41/40* (2023.01)
*H01L 23/528* (2006.01)
*H10B 12/00* (2023.01)
*H10B 41/10* (2023.01)
*H10B 43/10* (2023.01)
*H10B 43/40* (2023.01)
*H10D 86/00* (2025.01)

(52) U.S. Cl.
CPC ......... *H10B 41/40* (2023.02); *H01L 23/5283* (2013.01); *H10B 12/50* (2023.02); *H10B 41/10* (2023.02); *H10B 43/10* (2023.02); *H10B 43/40* (2023.02); *H10D 86/201* (2025.01)

(58) Field of Classification Search
CPC ...... H10D 86/201; H10B 10/18; H10B 12/09; H10B 12/50; H10B 51/40–50; H10B 53/40–50; H10B 43/40
See application file for complete search history.

(56) References Cited

U.S. PATENT DOCUMENTS

| | | |
|---|---|---|
| 7,605,429 B2 | 10/2009 | Bernstein et al. |
| 8,981,480 B2 | 3/2015 | Lim et al. |
| 9,490,264 B2 | 11/2016 | Mazure et al. |

(Continued)

FOREIGN PATENT DOCUMENTS

| | | |
|---|---|---|
| GB | 2006523 | 5/1979 |
| TW | 202213650 | 4/2022 |
| TW | 202220143 | 5/2022 |

*Primary Examiner* — Amar Movva
(74) *Attorney, Agent, or Firm* — Fish & Richardson P.C.

(57) ABSTRACT

A semiconductor memory device includes; a substrate and an insulating layer on the substrate, first and second peripheral active regions on the insulating layer, each having a first surface and an opposing second surface, a device isolation layer between the first and second peripheral active regions to isolate the first and second peripheral active regions, a bit line connected to at least one of the first surface of the first peripheral active region and the first surface of the second peripheral active region, a first gate insulating layer provided on the second surfaces of the first and second peripheral active regions, a first peripheral gate electrode disposed on the first gate insulating layer and a second peripheral gate electrode disposed on the second gate insulating layer, and a contact pattern connected to the bit line, wherein each of the first peripheral active region and the second peripheral active region is floated in relation to the substrate by the insulating layer.

17 Claims, 21 Drawing Sheets

(56) References Cited

U.S. PATENT DOCUMENTS

| | | |
|---|---|---|
| 9,601,595 B2 | 3/2017 | Yang et al. |
| 10,186,506 B2 | 1/2019 | Ryu |
| 10,748,934 B2 | 8/2020 | Liang et al. |
| 11,706,910 B2 | 7/2023 | Kim et al. |
| 2001/0021551 A1 | 9/2001 | Taniguchi et al. |
| 2009/0152613 A1 | 6/2009 | Kim |
| 2019/0074050 A1 | 3/2019 | Lacord et al. |
| 2022/0139921 A1 | 5/2022 | Kim et al. |

SEMICONDUCTOR MEMORY DEVICE AND METHOD OF MANUFACTURE

CROSS-REFERENCE TO RELATED APPLICATION

This U.S. non-provisional patent application claims priority under 35 U.S.C. § 119 to Korean Patent Application No. 10-2022-0065503 filed on May 27, 2022 in the Korean Intellectual Property Office, the subject matter of which is hereby incorporated by reference in its entirety.

BACKGROUND

The inventive concept relates generally to semiconductor memory devices and methods of manufacture for same. More particularly, the inventive concept relates to semiconductor memory devices in which active regions are floated from a substrate (substrate-Si), as well as methods of manufacture for same.

Under the weigh of increasing demands associated with miniaturization, multifunctionality, and reduced manufacturing costs, semiconductor devices have become very important elements in the electronics industry. Semiconductor devices may be broadly classified as memory devices storing data, logic devices processing data, and hybrid devices including a storage element and a logic element.

In accordance with demands for higher operating speeds and lower overall power consumption for various electronic devices, constituent semiconductor devices must provide higher operating speed at lower operating voltages. To satisfy these demands, contemporary and emerging semiconductor devices must be more highly integrated. However, as integration of a semiconductor device increases, reliability of the semiconductor device may decrease. Yet, commercial demands for high reliability remain in place. Accordingly, different approaches to improving reliability of highly integrated semiconductor device are ongoing.

A semiconductor devices include integrated circuits including metal oxide semiconductor (MOS) field effect transistors (FET). However, as both the size and related design rule associated with semiconductor devices are gradually reduced, the scale down of the MOS field effect transistor has accelerated. As the size of the MOS field effect transistor is reduced, operating characteristics of the semiconductor device may be negatively impacted. Accordingly, various methods of manufacture for semiconductor device providing superior performance while overcoming limitations due to high integration of the semiconductor device have been studied.

SUMMARY

Embodiments of the inventive concept provide semiconductor memory devices exhibiting improved electrical performance characteristics and better reliability.

Embodiments of the inventive concept provide methods of manufacture for semiconductor memory devices exhibiting improved electrical performance characteristics and better reliability.

In one embodiment of the inventive concept, a semiconductor memory device may include; a substrate including a cell array region and a peripheral circuit region, an insulating layer provided on the peripheral circuit region of the substrate, a bit line provided on the insulating layer and extending in a first direction, an isolation pattern provided on the insulating layer and covering a sidewall of the bit line, a first peripheral active region and a second peripheral active region disposed on the bit line and spaced apart by a device isolation layer, a first peripheral gate electrode and a second peripheral gate electrode respectively provided on the first peripheral active region and the second peripheral active region, and a contact pattern connected to the bit line, wherein at least one of the first active region and the second peripheral active region is connected to the bit line, and each of the first peripheral active region and the second peripheral active region has an island shape and is not connected to the substrate by the isolation layer, the isolation pattern, and the insulating layer.

In another embodiment of the inventive concept, a semiconductor memory device may include; a substrate and an insulating layer provided on the substrate, a first peripheral active region and a second peripheral active region on the insulating layer, each of the first peripheral active region and second peripheral active region having a first surface and an opposing second surface, a device isolation layer interposed between the first peripheral active region and the second peripheral active region to isolate the first peripheral active region and the second peripheral active region, a bit line connected to at least one of the first surface of the first peripheral active region and the first surface of the second peripheral active region, a first gate insulating layer provided on the second surface of the first peripheral active region and a second gate insulating layer provided on the second surface of the second peripheral active region, a first peripheral gate electrode disposed on the first gate insulating layer and a second peripheral gate electrode disposed on the second gate insulating layer, and contact pattern connected to the bit line, wherein each of the first peripheral active region and the second peripheral active region is floated in relation to the substrate by the insulating layer.

In still another embodiment of the inventive concept, a method of manufacture for a semiconductor memory device may include; preparing a first substrate including a semiconductor substrate, a buried insulating layer and an active layer, patterning the active layer to form a first peripheral active region and a second peripheral active region on the buried insulating layer, wherein each of the first peripheral active region and the second peripheral active region includes a first surface and an opposing second surface and facing the buried insulating layer, forming a device isolation layer separating the first peripheral active region and the second peripheral active region on the buried insulating layer, forming a bit line extending in a first direction on the first surface of at least one of the first peripheral active region and the second peripheral active region, forming an insulating layer on the bit line, bonding a second substrate on the insulating layer, removing the semiconductor substrate and the buried insulating layer of the first substrate to expose the second surface of the first peripheral active region and the second surface of the second peripheral active region, forming a gate electrode on the second surface of the first peripheral active region and on the second surface of the second peripheral active region, forming a peripheral insulating layer on the gate electrode, and forming a contact pattern connecting the bit line through the peripheral insulating layer and the device isolation layer.

BRIEF DESCRIPTION OF THE DRAWINGS

Advantages, benefits and features, as well as the making and use of the inventive concept will be more clearly understood upon consideration of the following detailed description together with the accompanying drawings, un which.

DETAILED DESCRIPTION

Throughout the written description and drawings like reference numbers and labels are used to denote like or similar elements, components, features and/or method steps.

Figure 1:
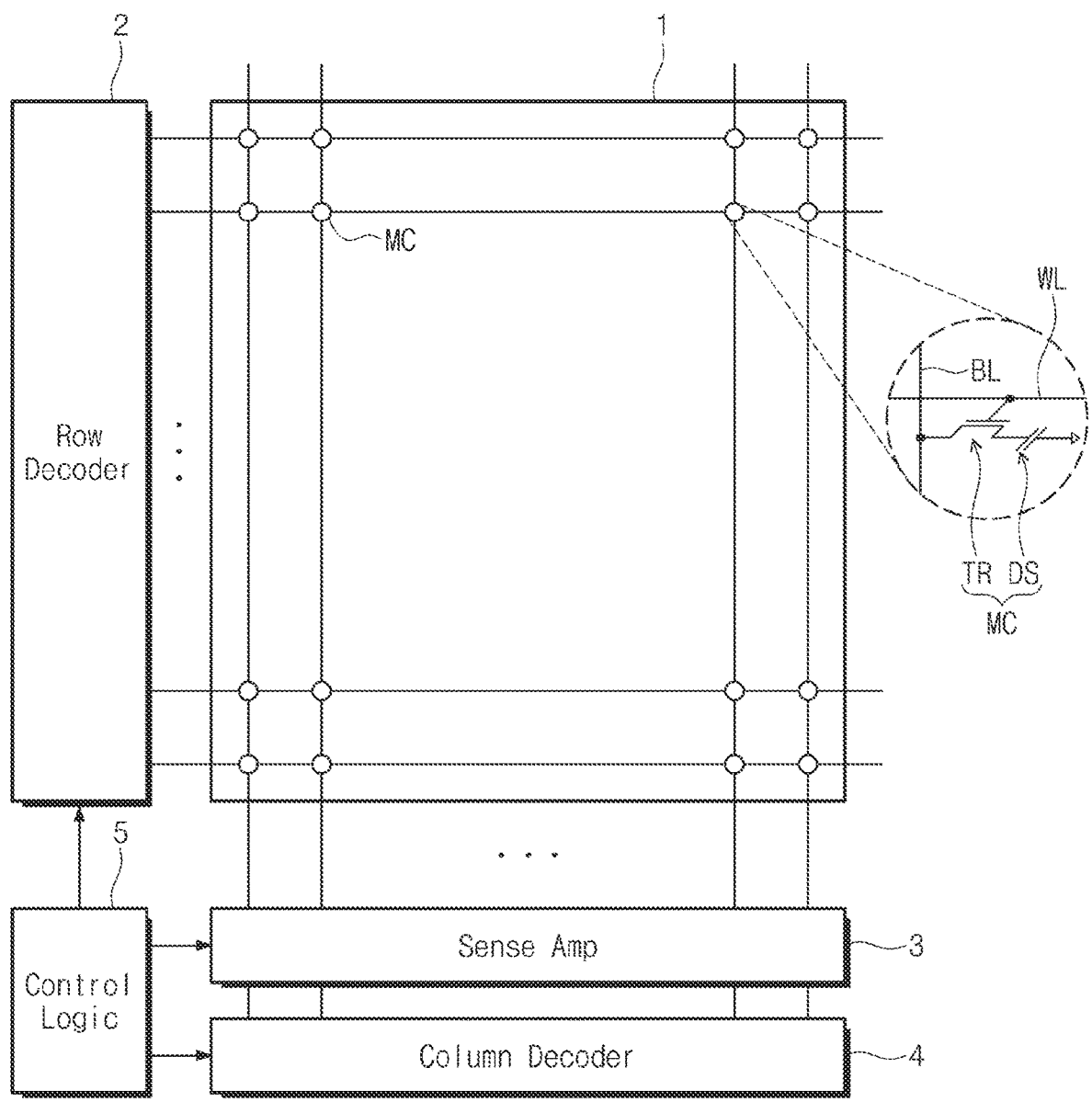
FIG. 1 is a block diagram illustrating a semiconductor memory device according to embodiments of the inventive concept.

FIG. 1 is a block diagram illustrating a semiconductor memory device according to embodiments of the inventive concept.

Referring to FIG. 1, the semiconductor memory device may include a memory cell array 1, a row decoder 2, a sense amplifier 3, a column decoder 4, and a control logic 5.

The memory cell array 1 may include a plurality of memory cells MC arranged two-dimensionally or three-dimensionally. Each of the memory cells MC may be connected between a word line WL and a bit line BL that cross each other.

Each of the memory cells MC may include a selection element TR and a data storage element DS, wherein the selection element TR and the data storage element DS may be electrically connected in series. The selection element TR may be connected between the data storage element DS and the word line WL, and the data storage element DS may be connected to the bit line BL through the selection element TR. In some embodiments, the selection element TR may be a field effect transistor (FET) or a vertical channel transistor (VCT). Here, the term "vertical channel transistor" denotes structure(s) in which a channel length extends in a vertical direction (e.g., a direction substantially perpendicular to an upper surface of the semiconductor substrate). The data storage element DS may be implemented as a capacitor, a magnetic tunnel junction pattern, or a variable resistor. For example, the selection element TR may include a transistor, wherein a gate electrode of the transistor is connected to the word line WL and drain/source terminals of the transistor may be connected to the bit line BL and the data storage element DS, respectively.

The row decoder 2 may be used to select one of the word lines WL of the memory cell array 1 in response to decoding an externally provided address. The address decoded by the row decoder 2 may be provided to a row driver (not shown), wherein the row driver may provide respective voltages to the selected word line(s) WL and the unselected word line(s) WL under the control of certain control circuits.

The sense amplifier 3 may sense (or detect), amplify, and output a voltage difference between the selected bit line BL and a reference bit line in response to the address decoded from the column decoder 4.

The column decoder 4 may provide a data transmission path between the sense amplifier 3 and an external device (e.g., a memory controller). The column decoder 4 may be used to select one of the bit lines BL by decoding the externally provided address.

The control logic 5 may be used to generate various control signals associated with the execution of a data access operation, such as for example, a write operation and a read operation in relation to the memory cells of the memory cell array 1.

In some embodiments, various sense amplifier circuit(s), sub-word line driver (SWD) circuit(s), power supply and ground driver circuit(s) associated with the sense amplifier 3 may be provided in relation to the memory cell array 1, but the scope of the inventive concept is not limited thereto.

Figure 2:
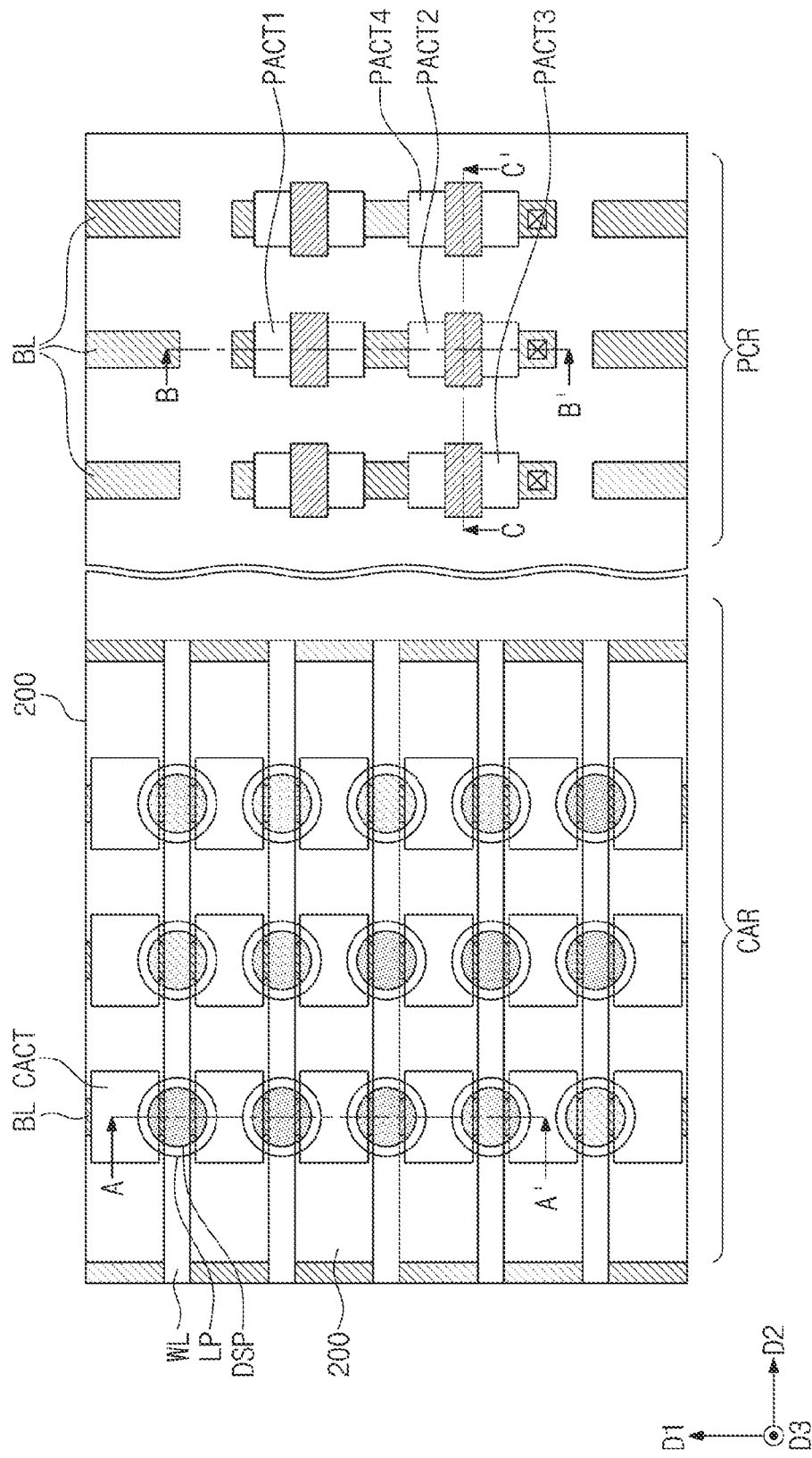
FIG. 2 is a plan (or top-down) view of a semiconductor memory device according to embodiments of the inventive concept.
Figure 3A:
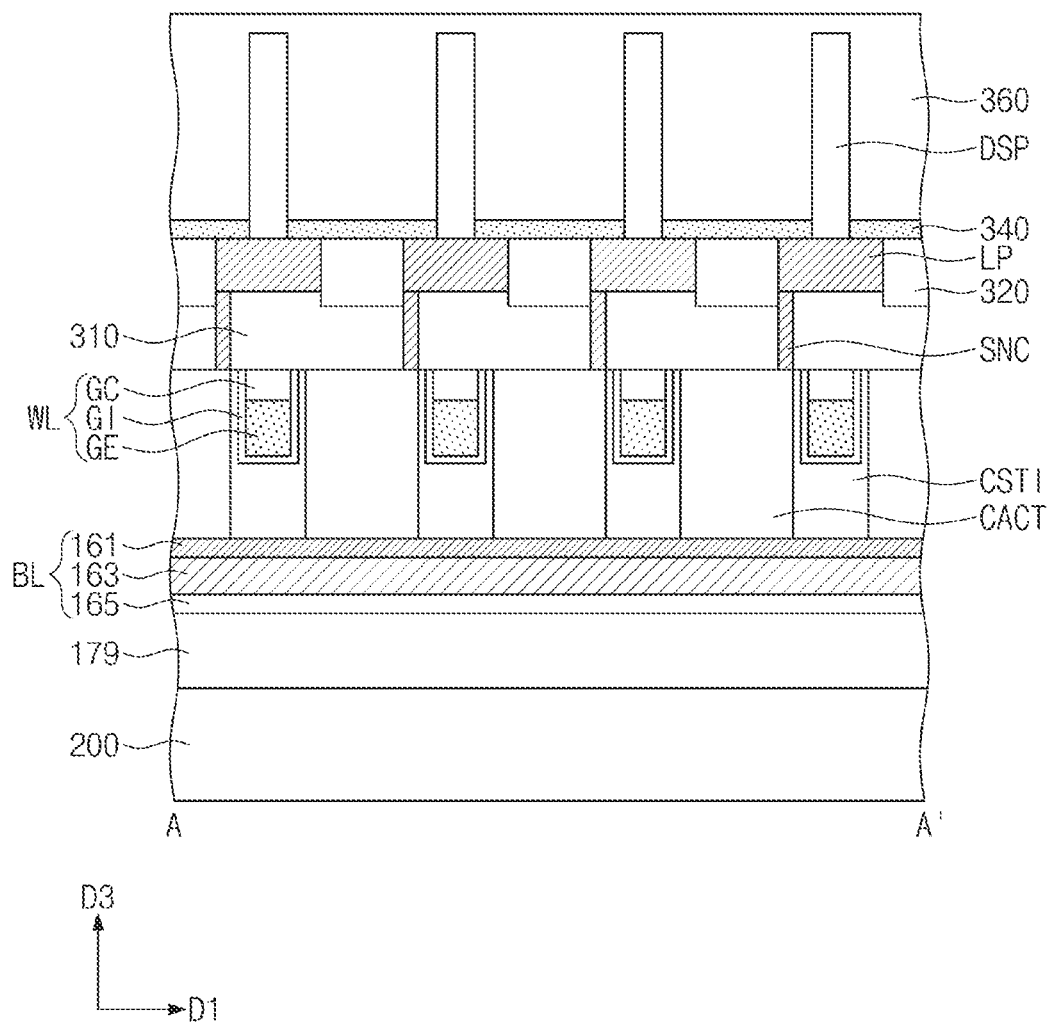
FIGS. 3A, 3B and 3C are cross-sectional views respectively taken along line A-A', line B-B', and line C-C' of FIG. 2.
Figure 3B:
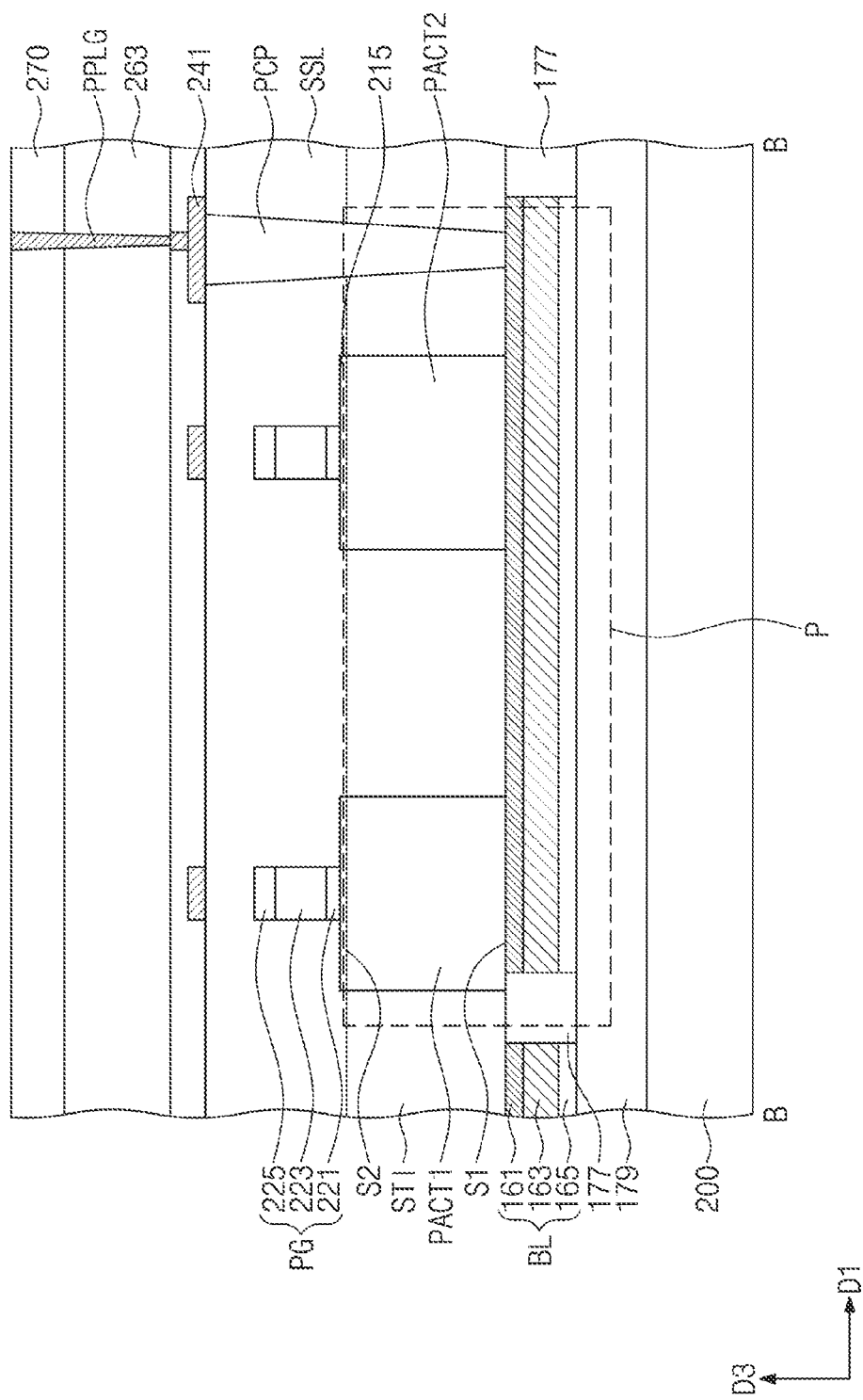
Figure 3C:
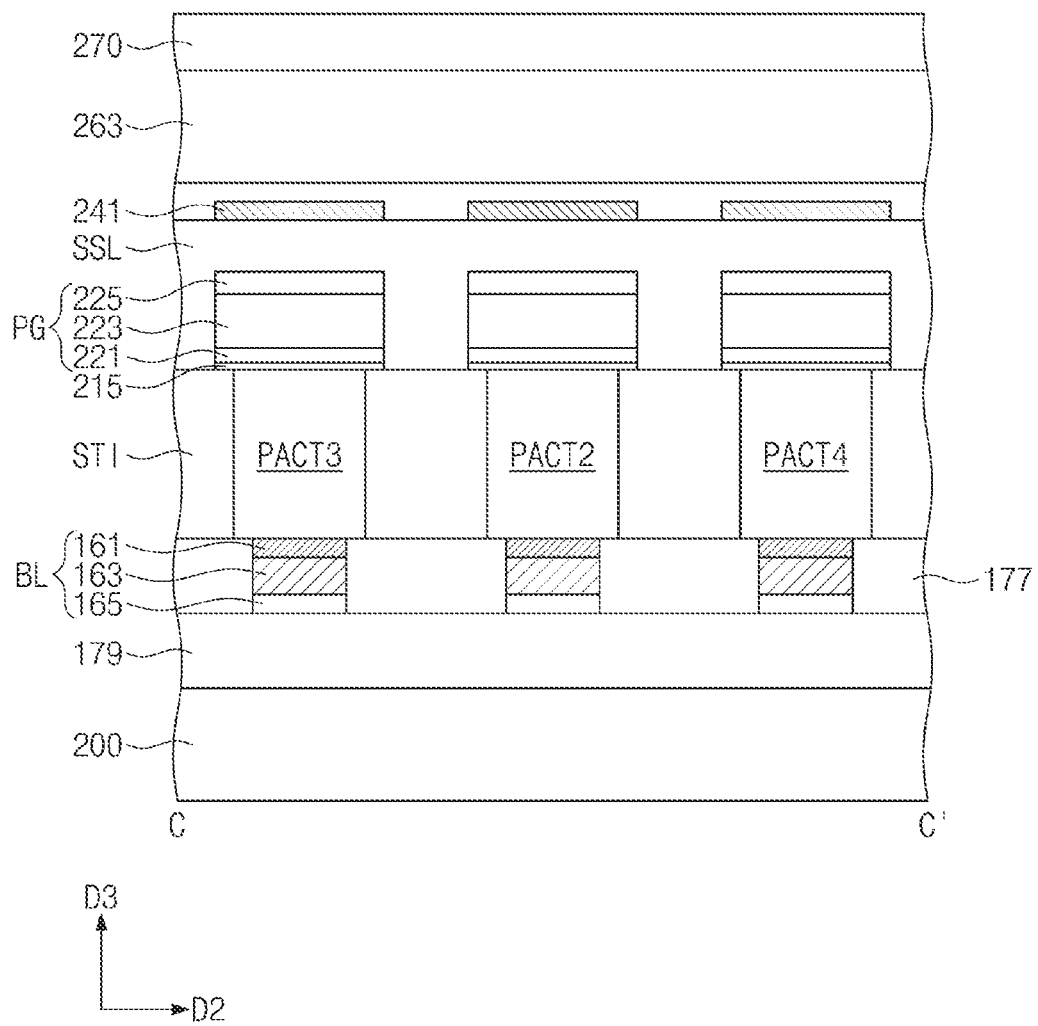

FIG. 2 is a plan (or top-down) view illustrating a semiconductor memory device according to embodiments of the inventive concept, and FIGS. 3A, 3B and 3C are respective cross-sectional views taken along lines A-A', B-B' and C-C' of FIG. 2.

Referring to FIGS. 1, 2, 3A, 3B and 3C, a semiconductor memory device may be formed on a substrate 200, wherein the substrate 200 may include at least one of a material having semiconductor properties (e.g., a silicon wafer), an insulating material (e.g., glass), a semiconductor covered by an insulating material, and/or a conductor. In some embodiments, the substrate 200 may be a single crystal silicon substrate. Alternately, the substrate 200 may be, for example, a silicon substrate, a germanium substrate, and/or a silicon-germanium substrate. The substrate 200 may include a cell array region (CAR) and a peripheral circuit region (PCR).

A core circuit including the sense amplifier 3 may be provided in the cell array region of the substrate 200, and peripheral circuits such as a word line driver and a control logic 5 may be provided in the peripheral circuit region of the substrate 200.

An insulating layer 179 may be provided on the substrate 200. The insulating layer 179 may be a buried oxide (BOX) formed by a separation by implanted oxygen (SIMIOX) method or a bonding and layer transfer method. Alternately, the insulating layer 179 may be an insulating layer formed by a chemical vapor deposition (CVD) method. The insulating layer 179 may be, for example, a silicon oxide layer (SiOx), a silicon nitride layer (SiN), a silicon oxynitride layer (SiON), a silicon carbide layer (SiC), or a silicon carbon nitride layer (SiCN), and/or a low-k layer.

Bit lines BL may be provided on the insulating layer 179 in a line shape. Alternately, the bit lines BL may be provided in a plate shape. The bit lines BL may extend in a first (horizontal) direction D1 on the insulating layer 179 and may be spaced apart in a second (horizontal) direction D2. Each of the bit lines BL may have a width in the second direction D2 that ranges between about 1 nm to about 50 nm.

The bit lines BL may include at least one of, for example, doped polysilicon, metal, conductive metal nitride, conductive metal silicide and conductive metal oxide. The bit lines BL may be formed of at least one of, for example, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx. The bit lines BL may include a single layer or multiple layers. In some embodiments, the bit lines BL may include at least one two-dimensional and three-dimensional materials, such as graphene, carbon-based, two-dimensional material(s), carbon nanotubes, and carbon-based, three-dimensional material(s).

Referring to FIGS. 3A, 3B and 3C, each of the bit lines BL may include a polysilicon pattern 161, a metal pattern 163, and a hard mask pattern 165 that are sequentially stacked. Here, the hard mask patterns 165 of the bit lines BL may contact with the insulating layer 179. The metal pattern 163 may include a conductive metal nitride (e.g., TiN or TaN) and a metal (e.g., tungsten, titanium or tantalum). The hard mask pattern 165 may include an insulating material, such as silicon nitride or silicon oxynitride. The metal pattern 163 may include a metal silicide such as titanium silicide, cobalt silicide, or nickel silicide.

Referring to FIGS. 3B and 3C, isolation patterns 177 may be provided on the insulating layer 179 in the peripheral circuit region. The isolation patterns 177 may cover sidewalls of the bit lines BL on the insulating layer 179. The isolation patterns 177 may be a buried oxide (BOX) formed by a separation by implanted oxygen (SIMIOX) method or a bonding and layer transfer method. Alternately, the isolation patterns 177 may be insulating layers formed by a chemical vapor deposition (CVD) method. The isolation patterns 177 may include, for example, a silicon oxide layer (SiOx), a silicon nitride layer (SiN), a silicon oxynitride layer (SiON), a silicon carbide layer (SiC), silicon carbon nitride layer (SiCN) and/or a low-k layer. The isolation patterns 177 may include the same material as the insulating layer 179.

Active regions CACT and PACT1, PACT2, PACT3 and PACT4 (hereafter collectively, "PACT1 to PACT4") may be provided on the insulating layer 179 to be spaced apart from the substrate 200. That is, the active regions CACT and PACT1 to PACT4 may be electrically floated in relation to the substrate 200. As used herein, the term "float" (or "floated", or "floating") denotes an electrically non-connected relationship between the active regions CACT and PACT1 to PACT4 and the substrate 200. Alternately or additionally, the term "float" (or "floated", or "floating") denotes a structural relationship in which the active regions CACT and PACT1 to PACT4 are physically disposed on the bit line and fixed by device isolation layers CSTI and STI.

Thus, the active regions CACT and PACT1 to PACT4 may be provided on the bit lines BL buried in the insulating layer 179. Alternately, the active regions CACT and PACT1 to PACT4 may be provided on the bit lines BL provided on the insulating layer 179. The cell active regions CACT may be provided on the bit lines BL of the cell array region CAR, and the peripheral active regions PACT1 to PACT4 may be provided on the bit lines BL of the peripheral circuit region PCR. In some embodiments, the active regions CACT and PACT1 to PACT4 may include a single crystal semiconductor material.

Each of the cell active regions CACT may be defined by a cell device isolation layer CSTI. The cell device isolation layer CSTI may be disposed between the cell active regions CACT and provided on the bit lines BL. The cell device isolation layer CSTI may include at least one of, for example, silicon oxide, silicon nitride, and silicon oxynitride.

Referring to FIGS. 2 and 3A, word lines WL may be provided between the cell active regions CACT. That is, the word lines WL may be provided in a buried form in the cell device isolation layer CSTI. Upper surfaces of the word lines WL may be coplanar with upper surfaces of the cell active regions CACT and a upper surface of the cell device isolation layer CSTI. The word lines WL may extend in the second direction D2 across the bit lines BL and may be spaced apart in the first direction D1.

Each of the word lines WL may include a gate dielectric pattern GI, a gate electrode GE, and a gate capping pattern GC. The gate dielectric pattern GI may be formed to conformally cover a trench inside the cell active regions CACT. The gate electrode GE may be provided on the gate dielectric pattern GI. The gate capping pattern GC may be provided on the gate electrode GE. The gate electrode GE may include at least one conductive material, such as for example, a doped semiconductor material (doped polysilicon, doped germanium), a conductive metal nitride (titanium nitride, tantalum nitride), a metal (tungsten, titanium, tantalum) and a metal-semiconductor compound (tungsten silicide, cobalt silicide, titanium silicide). The gate electrode GE of the word line WL may include at least one of for example, doped polysilicon (poly-Si), Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx. The gate dielectric pattern GI may include at least one of for example, a silicon oxide layer, a silicon nitride layer, and a silicon oxynitride layer. The gate capping pattern GC may include at least one of for example, a silicon oxide layer, a silicon nitride layer, and a silicon oxynitride layer.

The word lines WL may include a single layer or multiple layers. In some embodiments, the word lines WL may include a two-dimensional semiconductor material, such as for example, graphene and carbon nanotube.

Referring to FIGS. 2, 3B, and 3C, the peripheral active regions PACT1 to PACT4 may be provided on the bit lines BL of the peripheral circuit region PCR. The peripheral active regions PACT1 to PACT4 may include a single crystal semiconductor material. The peripheral active regions PACT1 to PACT4 may be a P-well region or an N-well region of a peripheral circuit.

Each of the peripheral active regions PACT1 to PACT4 may be defined by a device isolation layer STI. The device isolation layer STI may be disposed between the peripheral active regions PACT1 to PACT4 and provided on the bit lines BL. The device isolation layer STI may include at east one of for example, silicon oxide, silicon nitride, and silicon oxynitride.

For example, the first and second peripheral active regions PACT1 and PACT2 disposed on the bit lines BL may be spaced apart by the device isolation layer STI. Each of the first and second peripheral active regions PACT1 and PACT2 may have a first surface S1 and an opposing second surface S2, as well as a first side surface and an opposing second side surface. The first and second side surfaces may be adjacent to the device isolation layer STI. At least one of the first surfaces S1 of the first and second peripheral active regions PACT1 and PACT2 may be connected to the bit line BL. That is, the polysilicon pattern 161 of the bit line BL may be electrically connected to the first surfaces S1 of the first and second peripheral active regions PACT1 and PACT2. However, each of the first and second peripheral active regions PACT1 and PACT2 are not connected to the substrate 200 (sub-Si) by the device isolation layer STI, the bit line BL, and the isolation pattern 177. That is, each of the first and second peripheral active regions PACT1 and PACT2 may be electrically isolated, and may have an island shape.

Each of the first and second peripheral active regions PACT1 and PACT2 may not be connected to the substrate 200 (sub-Si). Accordingly, an N-MOSFET and a P-MOS- FET will not share a well through the substrate 200 in the peripheral circuit region PCR. That is, in the semiconductor memory device according to embodiments of the inventive concept, a P-well and an N-well will not be formed adjacent to each other. As each of the active regions PACT1 and PACT2 do not share the substrate 200 (sub-Si), a PN junction will not result. And accordingly, no depletion region associated with the PN junction will be formed. It follows that a semiconductor memory device according to embodiments of the inventive concept will exhibit improved leakage current characteristics in this regard.

From the foregoing those skilled in the art will appreciate that within the context of embodiments of the inventive concept, a well will not be shared—even in the cell array region CAR. Accordingly, by inhibiting leakage current, the electrical performance characteristics of the semiconductor memory device may be improved.

Referring to FIGS. 2 and 3A, landing pads LP may be disposed on word lines WL. The landing pads LP may contact the cell active regions CACT through storage node contacts SNC. The storage node contacts SNC may be interposed between insulating fences 310. The storage node contacts SNC may include doped or undoped polysilicon. The insulating fences 310 may include, for example, silicon nitride. A landing insulating pattern 320 may fill between the landing pads LP. That is, the landing pads LP may be separated by the landing insulating pattern 320. The landing pads LP may have various shapes such as a circle, an ellipse, a rectangle, a square, a rhombus, and a hexagon. The landing pads LP may include at least one of for example, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx and RuOx.

In some embodiments, data storage patterns DSP may be respectively disposed on the landing pads LP. The data storage patterns DSP may be electrically and respectively connected to the cell active regions CACT through the landing pads LP and the storage node contacts SNC. The data storage patterns DSP may be arranged in a matrix (e.g., a horizontal layout defined in relation to the first direction D1 and the second direction D2). Accordingly, the data storage patterns DSP may be capacitors, and may include a capacitor dielectric layer interposed between lower electrode and upper electrode 360. The upper electrode 360 may fill a space between the lower electrode. The upper electrode 360 may include at least one of a polysilicon film doped with impurities, a silicon germanium film doped with impurities, a metal nitride film such as a titanium nitride film, and a metal film such as tungsten, aluminum, and copper. In addition, an etch stop layer 340 may cover the landing insulating pattern 320 between the data storage patterns DSP. The etch stop layer 340 may include, for example, an insulating material such as silicon nitride, silicon oxide, or silicon oxy-nitride. In this case, the lower electrode may contact with the landing pad LP, and the lower electrode may have various shapes such as a circle, an ellipse, a rectangle, a square, a rhombus, and a hexagon.

Alternately, the data storage patterns DSP may be a variable resistance pattern that is capable of being switched between two resistive states by an electrical pulse applied to a memory element. For example, the data storage patterns DSP may include a phase-change material, perovskite compounds, a transition metal oxide, and a magnetic material. magnetic materials, ferromagnetic materials, or antiferromagnetic materials, whose crystal state changes depending on an amount of current.

Referring to FIGS. 3B and 3C, peripheral circuit transistors may be provided on the first and second peripheral active regions PACT1 and PACT2. That is, a peripheral gate insulating layer 215 may be disposed on the second surfaces S2 of the first and second peripheral active regions PACT1 and PACT2. A peripheral gate electrode PG may be disposed on the peripheral gate insulating layer 215. The peripheral gate electrode PG may include a peripheral conductive pattern 221, a peripheral metal pattern 223, and a peripheral mask pattern 225. A peripheral insulating layer SSL covering the peripheral gate electrodes PG may be provided on the device isolation layer STI and the peripheral active regions PACT1 to PACT4.

The contact pattern PCP may pass through the peripheral insulating layer SSL and the device isolation layer STI to be connected to the polysilicon pattern 161 of the bit lines BL. The contact pattern PCP may be connected to the peripheral wiring 241. A contact plug PPLG may pass through a peripheral circuit insulating layer 263 and an upper insulating layer 270 to be connected to the peripheral wiring 241. The contact pattern PCP may include at least one of for example, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx and RuOx.

Figure 4A:
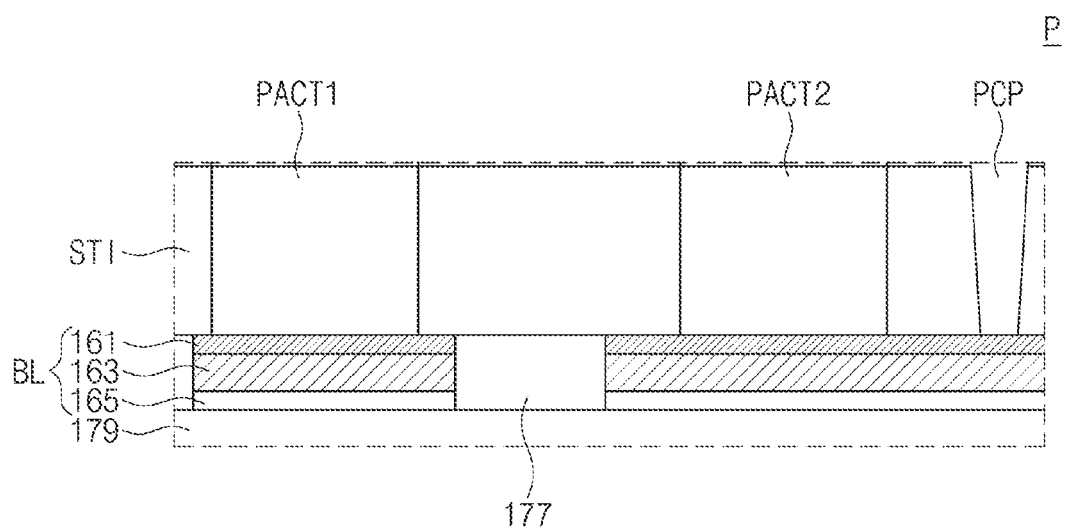
FIGS. 4A, 4B, 4C, 4D, 4E, 4F, 4G, 4H, 4I, 4J, 4K, and 4L (hereafter collectively, "FIGS. 4A to 4L") are respective cross-sectional views further illustrating region 'P' indicated in FIG. 3B according to various embodiments of the inventive concept.
Figure 4B:
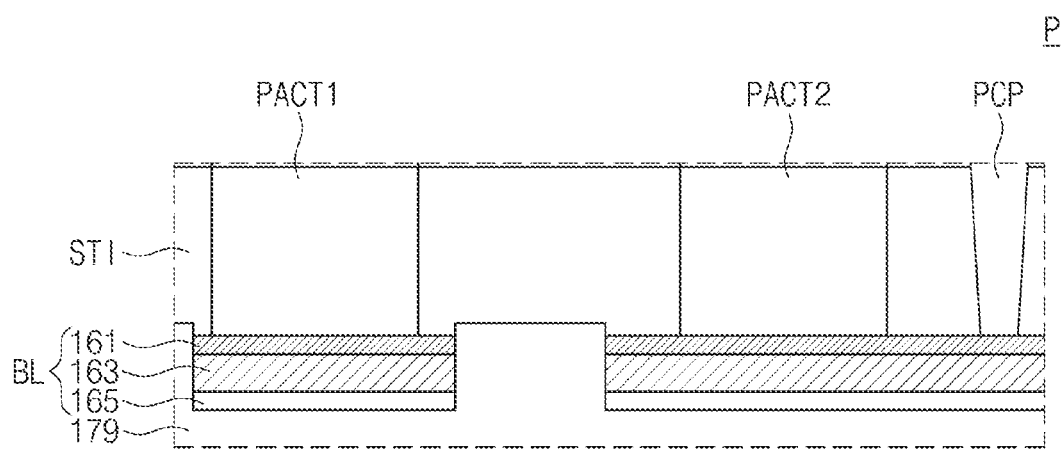

FIGS. 4A to 4L are respective cross-sectional diagram illustrating differing possible versions of the region 'P'' indicated in FIG. 3B according to various embodiments of the inventive concept. In this regard, FIGS. 4A and 4B are cross-sectional views illustrating arrangements of the bit lines BL, the isolation pattern 177, and the insulating layer 179 provided under the peripheral active regions PACT1 and PACT2; FIGS. 4C, 4D, 4E and 4F are cross-sectional views illustrating various connection patterns 'HDC' and 'DC'; and FIGS. 4G, 4H, 4I, 4J, 4K and 4L are cross-sectional views illustrating various metal silicide patterns SC.

Referring to FIGS. 3B, 4A, and 4B, in the peripheral circuit region PCR, the bit lines BL may be spaced apart by the isolation pattern 177. Each of the spaced apart bit lines BL may be connected to the first surfaces S1 of the first and second peripheral active regions PACT1 and PACT2. That is, the upper surfaces of the polysilicon patterns 161 of the first and second bit lines BL may be electrically connected to the first surfaces S1 of the first and second peripheral active regions PACT1 and PACT2, respectively. Accordingly, one peripheral active region PACT may correspond to one bit line BL. The upper surface of the isolation pattern 177 and the upper surfaces of the bit lines BL may be coplanar.

One contact pattern PCP may be connected to the one bit line BL. That is, the second bit line BL corresponding to the second peripheral active region PACT2 and the second contact pattern PCP contacting the second bit line BL may act as one unit. A variable voltage may be applied to the second contact pattern PCP. The variable voltages may be differently applied to each of the contact patterns PCP. Accordingly, different well biases may be applied to each of the peripheral active regions PACT1 to PACT4.

In some embodiments, the different well biases may be applied to the cell array region CAR and the peripheral circuit region PCR through the plurality of bit lines BL, respectively. That is, the contact patterns correspond to each of the active regions, and the bias applied to the contact patterns of the cell array region CAR may be different from the bias applied to the contact patterns of the peripheral circuit region PCR. Accordingly, a desired forward bias and a reverse bias differently for each region may be applied, thereby improving the switching function (ON/OFF) of the transistor in the semiconductor memory device. A well bias optimized for performance of the semiconductor memory device may be applied. The structure of the active region (well) according to the embodiment of the inventive concept may also be applied to a vertical channel transistor (VCT), thereby improving overall integration of the semiconductor device.

In some embodiments, the bit lines BL may be spaced apart by the insulating layer 179. In this case, the bit lines BL may be patterned using a positive photoresist. That is, a photo/etching/deposition process may be performed using the positive photoresist. During the etching process, a portion of the device isolation layer STI may be etched to form a deep trench. Accordingly, when the wafer is inverted, an upper surface of the insulating layer 179 may be formed to be higher than the first surfaces S1 of the peripheral active regions PACT1 and PACT2.

Figure 4C:
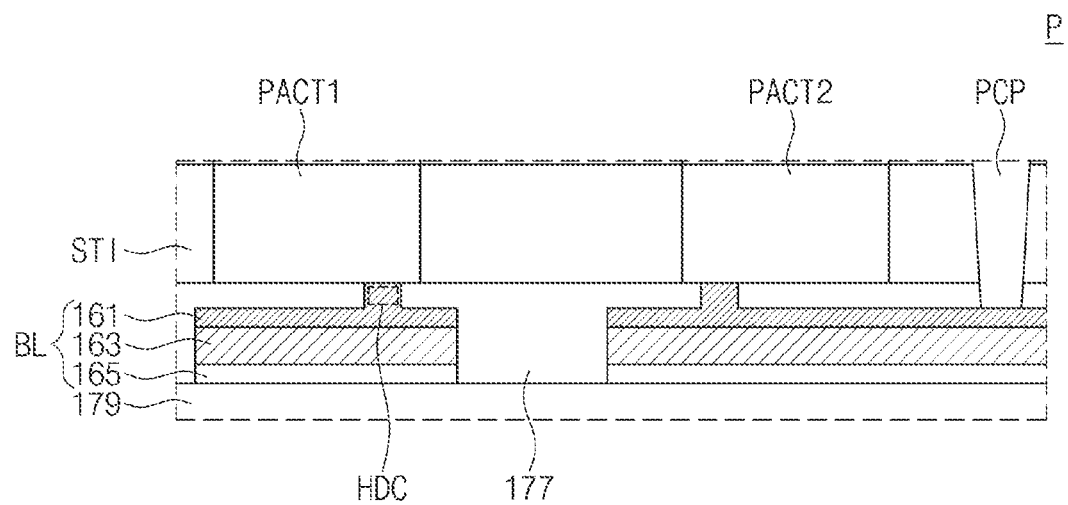
Figure 4D:
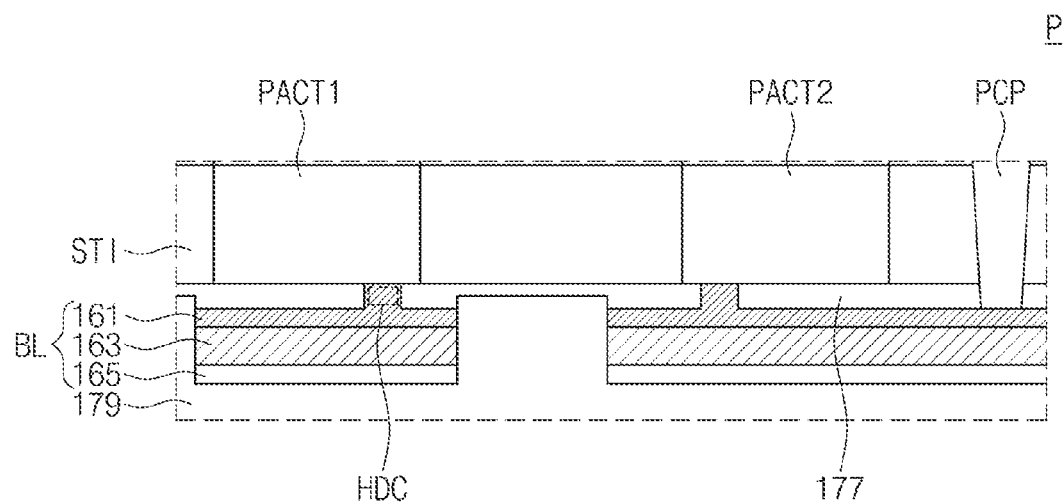

Referring to FIGS. 3B, 4C, and 4D, the connection patterns HDC may be provided between the bit lines BL and the first and second peripheral active regions PACT1 and PACT2. That is, the connection patterns HDC may be provided between the upper surfaces of the polysilicon patterns 161 and the first surfaces S1 of the peripheral active regions PACT1 and PACT2. The connection patterns HDC may be interposed between the isolation patterns 177. The connection patterns HDC may include a conductive material, and the conductive material may be, for example, a doped semiconductor material (e.g., doped polysilicon or doped germanium). The connection patterns HDC may include the same material as the polysilicon pattern 161. The connection patterns HDC may have various shapes such as a circle, an ellipse, a rectangle, a square, a rhombus, and a hexagon. The lower surface of the contact pattern PCP may be formed to be lower than the first surfaces S1 of the peripheral active regions PACT1 and PACT2.

The bit line BL and the peripheral active regions PACT1 and PACT2 may not be fully in direct contact due to the interposition of the connection patterns HDC. Accordingly, an area of direct contact between the peripheral active regions PACT1 and PACT2 and the bit lines BL may be reduced. As this direct contact area is reduced in size, damage to the surrounding active regions may be reduced in relation to process(es) associated with the forming of the bit line BL. And since damage may be thus prevented, overall reliability of the semiconductor memory device may be improved.

Figure 4E:
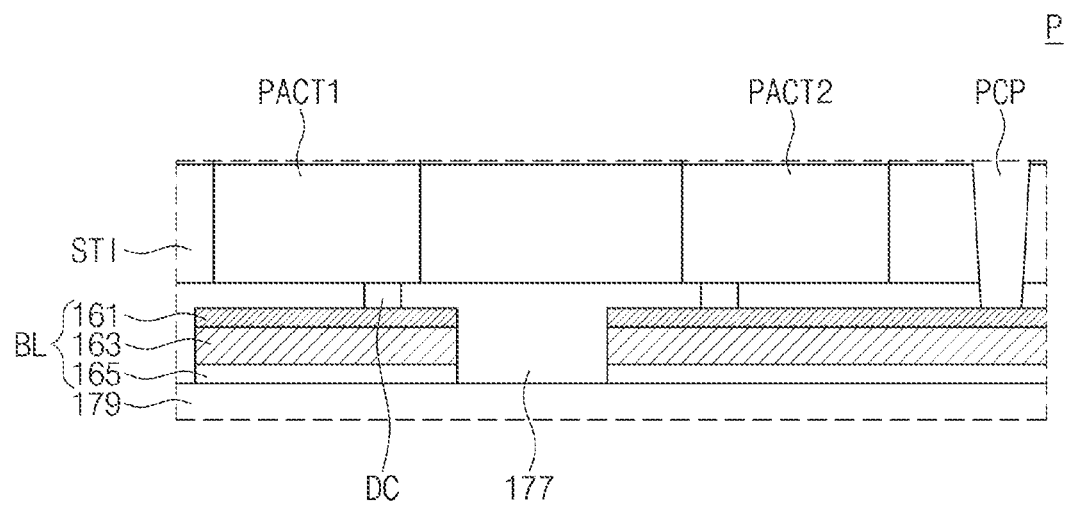
Figure 4F:
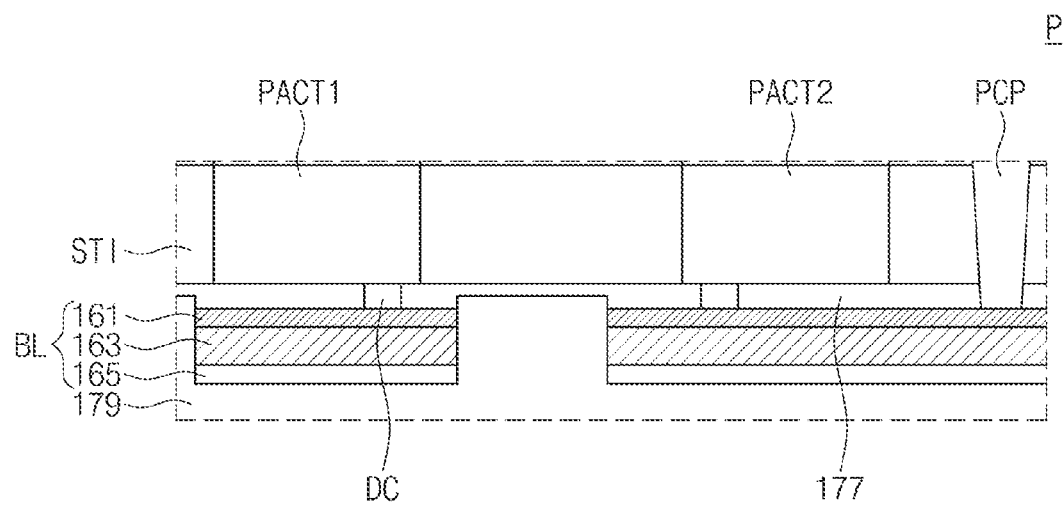

Referring to FIGS. 3B, 4E, and 4F, the connection patterns DC may be provided between the bit lines BL and the first and second peripheral active regions PACT1 and PACT2. That is, the connection patterns DC may be provided between the upper surfaces of the polysilicon patterns 161 and the first surfaces S1 of the peripheral active regions PACT1 and PACT2. The connection patterns DC may include at least one of for example, titanium nitride, tantalum nitride, tungsten, titanium, and tantalum. The connection patterns DC may have various shapes such as a circle, an ellipse, a rectangle, a square, a rhombus, and a hexagon. The lower surface of the contact pattern PCP may be formed to be lower than the first surfaces S1 of the peripheral active regions PACT1 and PACT2. Alternately, the bit lines BL may be spaced apart by the insulating layer 179, and the bit lines BL may be patterned using a positive photoresist.

Figure 4G:
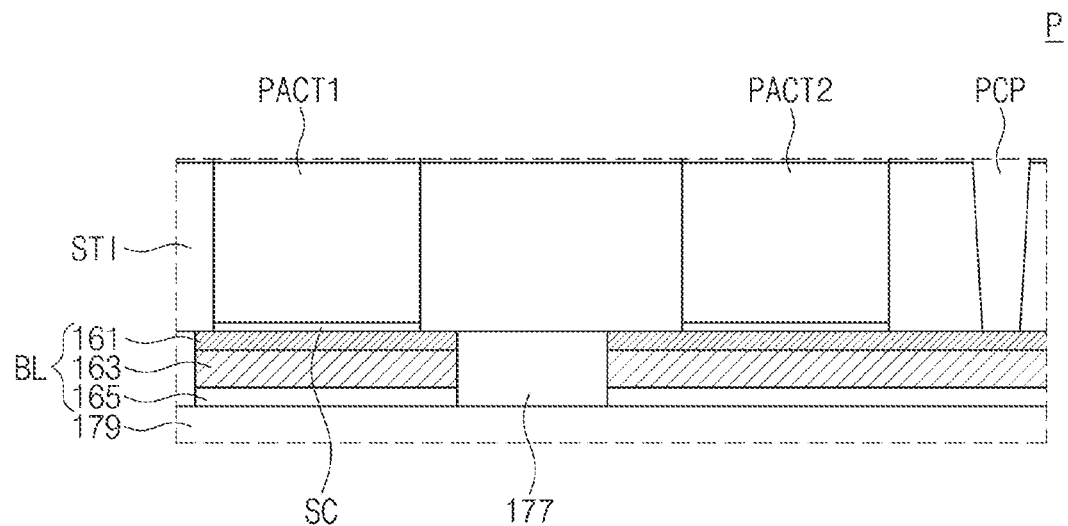
Figure 4H:
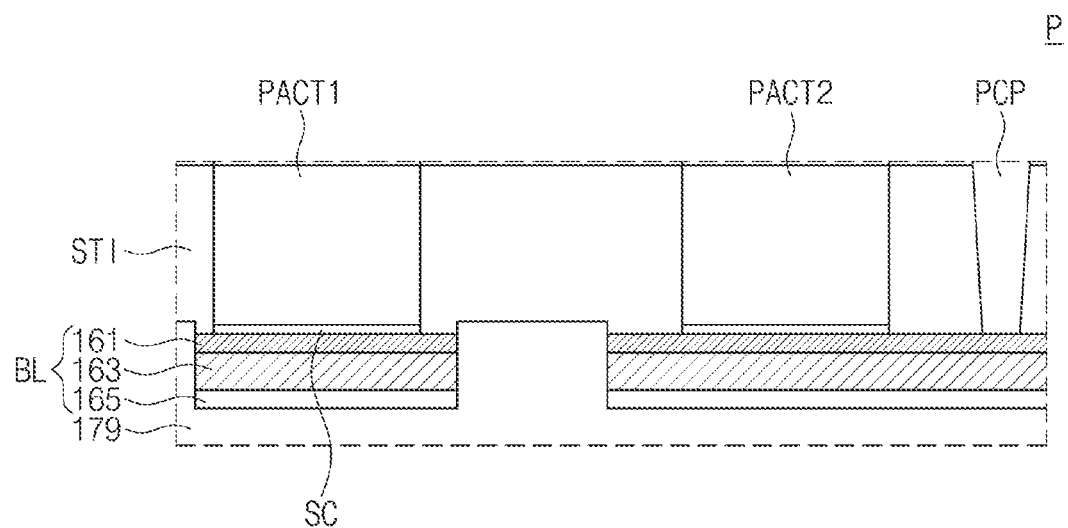

The embodiments illustrated in FIGS. 4G and 4H may be substantially similar to those illustrated in FIGS. 4A and 4B, except for the addition of metal silicide patterns SC. The metal silicide patterns SC may be provided between the bit lines BL and the first and second peripheral active regions PACT1 and PACT2. That is, the metal silicide patterns SC may be provided between the upper surfaces of the polysilicon patterns 161 and the peripheral active regions PACT1 and PACT2. Here, the metal silicide patterns SC may be at least partially buried in the peripheral active regions PACT1 and PACT2. That is, the metal silicide patterns SC may be provided on the first surfaces S1 (see, FIG. 3B) of the peripheral active regions PACT1 and PACT2. The metal silicide patterns SC may include at least one of for example, titanium silicide, cobalt silicide and nickel silicide.

As the metal silicide patterns SC are formed, a Schottky barrier may be reduced. Accordingly, operation of the transistor may be smoothed. Before forming the bit line BL, a thin barrier metal layer (e.g., TiN) may be formed on the peripheral active regions PACT1 and PACT2. Thereafter, annealing may be performed on the barrier metal layer to form metal silicide patterns SC.

Figure 4I:
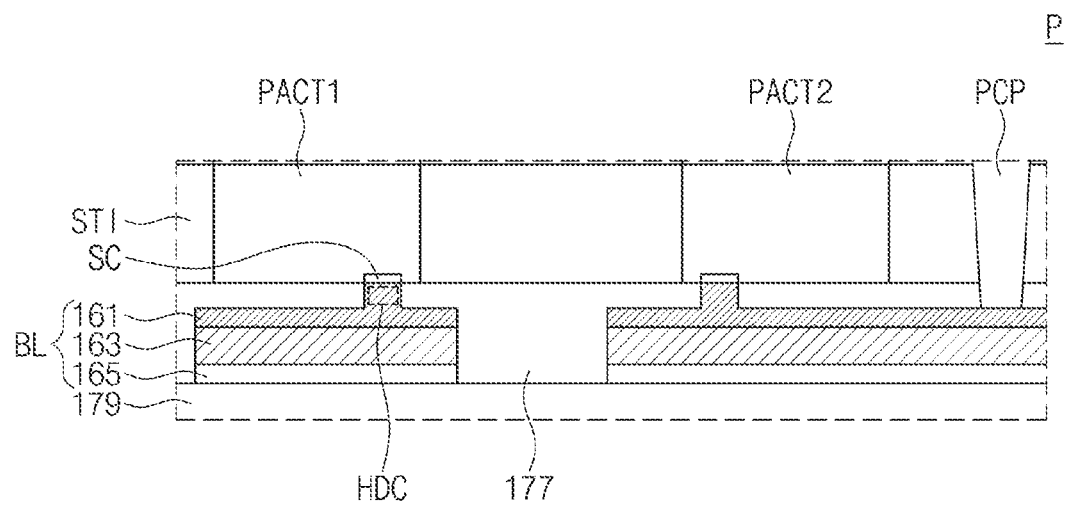
Figure 4J:
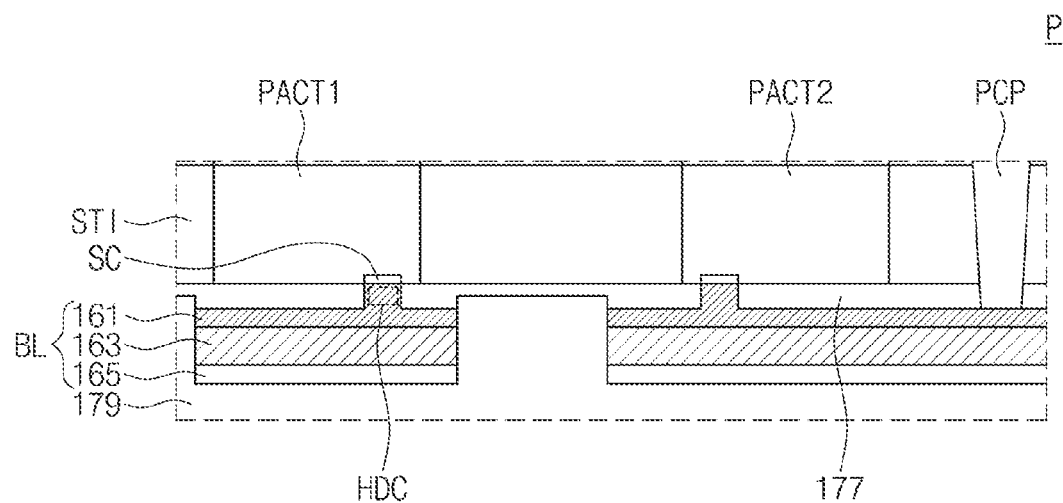

The embodiments illustrated in FIGS. 4I and 4J may be substantially similar to those illustrated in FIGS. 4C and 4D, except for the addition of metal silicide patterns SC.

The metal silicide patterns SC may be provided on the bit lines BL. That is, the metal silicide patterns SC may be provided on the upper surfaces of the connection patterns HDC. The metal silicide patterns SC may be at least partially buried in the peripheral active regions PACT1 and PACT2. That is, the metal silicide patterns SC may be provided on a portion of the first surfaces S1 (see, FIG. 3B) of the peripheral active regions PACT1 and PACT2.

Figure 4K:
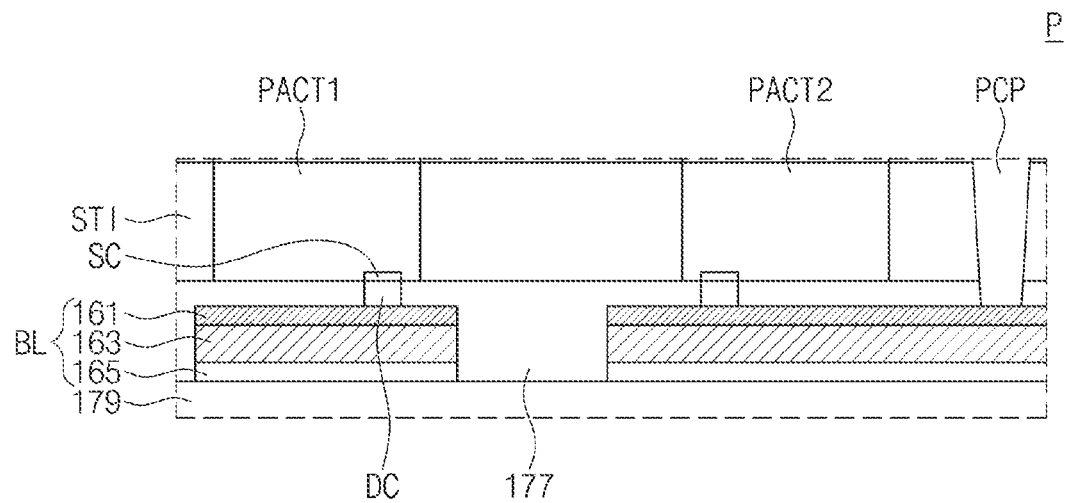
Figure 4L:
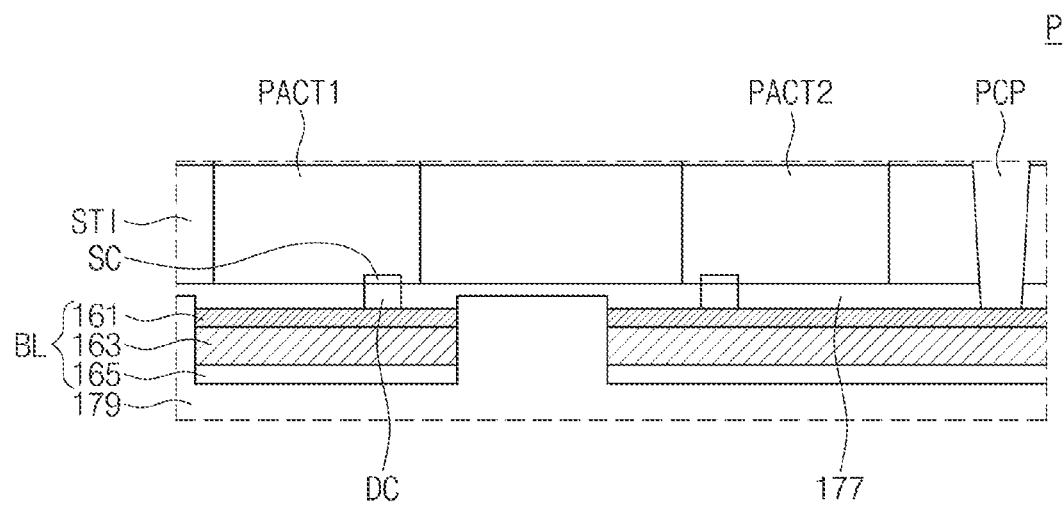

The embodiments illustrated in FIGS. 4K and 4L may be substantially similar to those illustrated in FIGS. 4C and 4D, except for the addition of metal silicide patterns SC. The metal silicide patterns SC may be provided on the bit lines BL. That is, the metal silicide patterns SC may be provided on the upper surfaces of the connection patterns DC. The metal silicide patterns SC may be at least partially buried in the peripheral active regions PACT1 and PACT2. That is, the metal silicide patterns SC may be provided on a portion of the first surfaces S1 (see, FIG. 3B) of the peripheral active regions PACT1 and PACT2.

Figure 5:
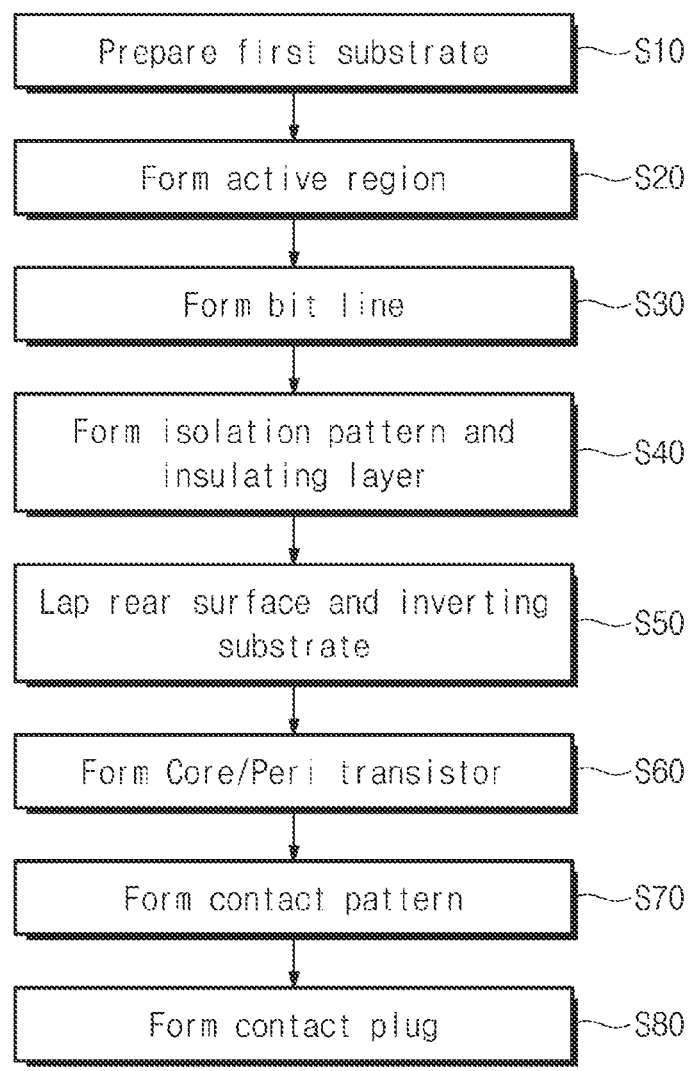
FIG. 5 is a flowchart illustrating a method of manufacture for a semiconductor memory device according to embodiments of the inventive concept.

FIG. 5 is a flowchart illustrating a method of manufacture for a semiconductor memory device according to embodiments of the inventive concept. FIGS. 6 to 14 are related cross-sectional views further illustrating the method of manufacture for a semiconductor memory device according to embodiments of the inventive concept.

Figure 6:
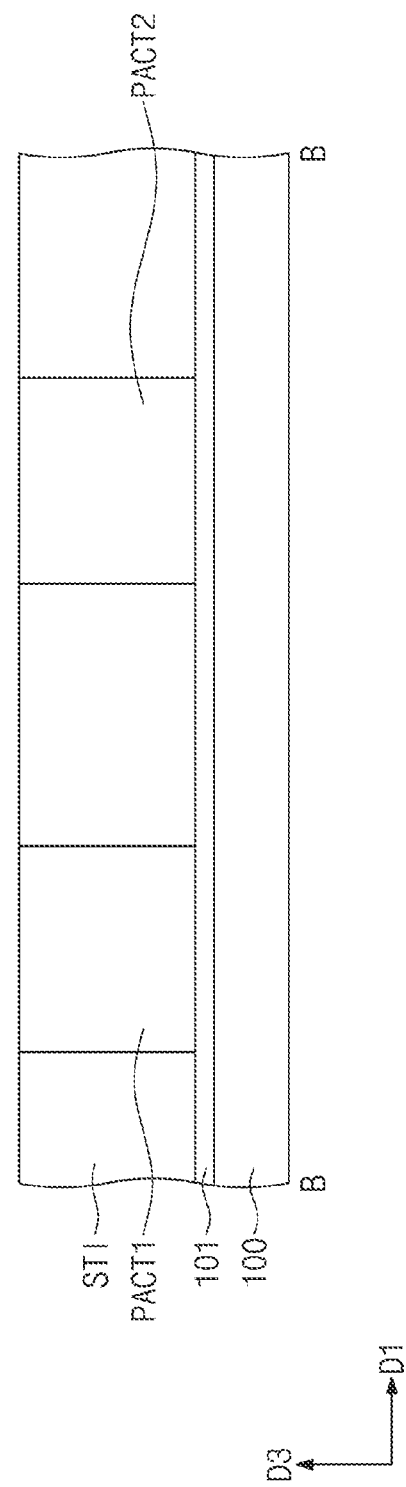
FIGS. 6, 7, 8, 9, 10, 11, 12, 13 and 14 (hereafter collectively, "FIGS. 6 to 14") are related cross-sectional views illustrating in one embodiment a method of manufacture for a semiconductor memory device according to embodiments of the inventive concept.

Referring to FIGS. 5 and 6, a first substrate structure including a first substrate 100, a buried insulating layer 101, and an active layer may be prepared (S10). The buried insulating layer 101 and the active layer may be provided on the first substrate 100. The first substrate 100 may include a cell array region (CAR) and a peripheral circuit region (PCR). (See, FIG. 1). The first substrate 100, the buried insulating layer 101, and the active layer may be a silicon-on-insulator substrate (i.e., an SOI substrate). The first substrate 100 may be, for example, a silicon substrate, a germanium substrate, and/or a silicon-germanium substrate.

The buried insulating layer 101 may include a silicon oxide layer, a silicon nitride layer, a silicon oxynitride layer, and/or a low-k layer. The active layer may be a single crystal semiconductor layer. The active layer may be, for example, a single crystal silicon substrate, a germanium substrate, and/or a silicon-germanium substrate. The active layer may have a first surface and an opposing second surface, wherein the second surface contacts the buried insulating layer 101.

A device isolation layer STI may be formed in the active layer of the peripheral circuit region PCR. Accordingly, peripheral active regions PACT1 and PACT2 may be spaced apart by the device isolation layer STI (S20). The device isolation layer STI may be formed by patterning the active layer of the peripheral circuit region PCR to form a device isolation trench exposing the buried insulating layer 101, and then filling the isolation trench with at least one insulating material. An upper surface of the device isolation layer STI may be substantially coplanar with upper surfaces of the peripheral active regions PACT1 and PACT2.

Figure 7:
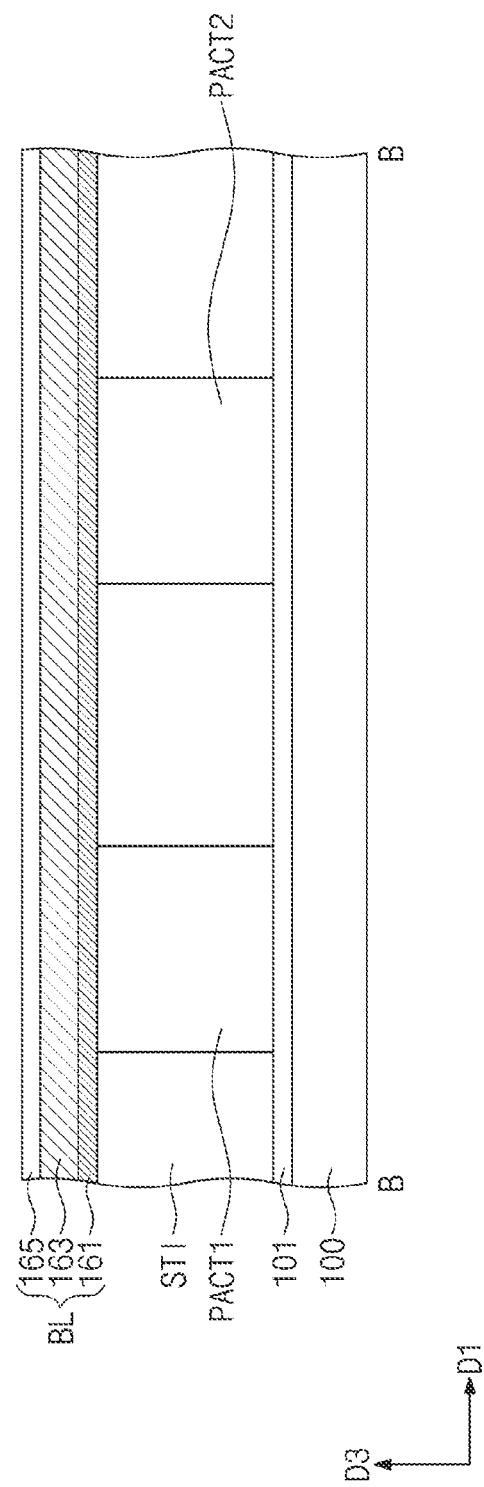

Referring to FIGS. 5 and 7, a bit line BL may be formed on the device isolation layer STI and the peripheral active regions PACT1 and PACT2 (S30). The bit line BL may include a polysilicon layer 161, a metal layer 163, and a hard mask layer 165 that are sequentially stacked. The bit line BL may extend in the first direction D1. Alternately, the bit line BL may be provided in a plate shape on the upper surfaces of the device isolation layer STI and peripheral active regions PACT1 and PACT2.

Figure 8:
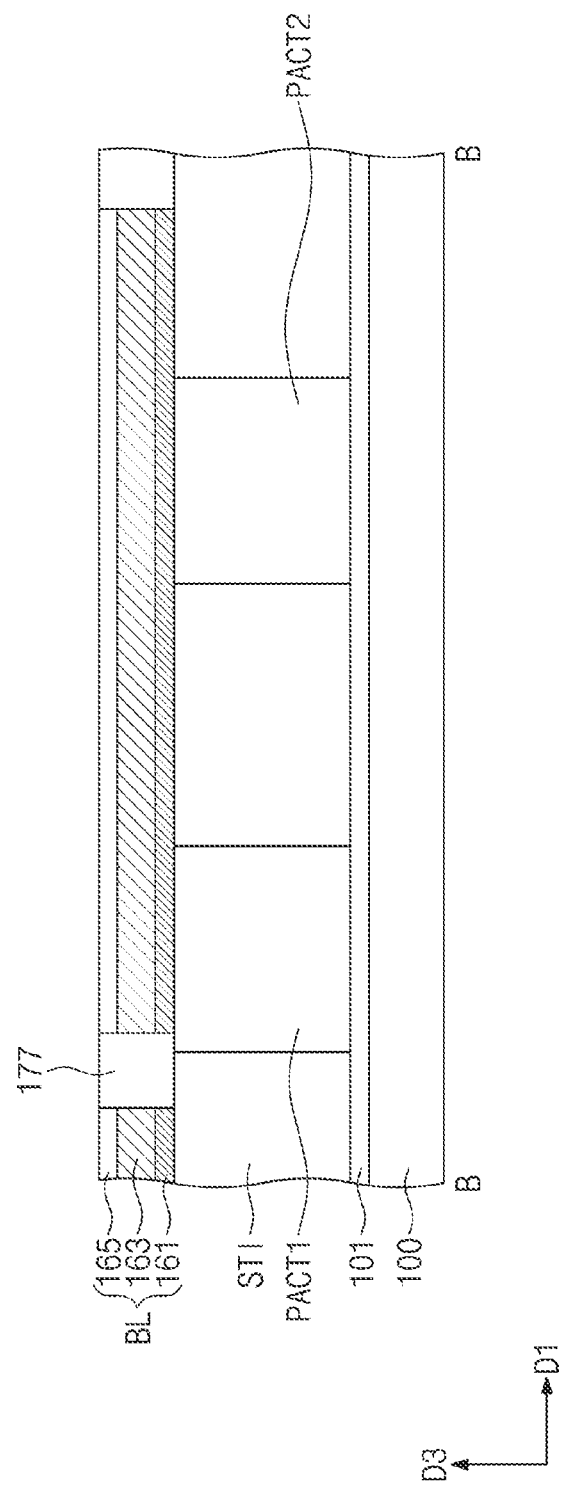
Figure 9:
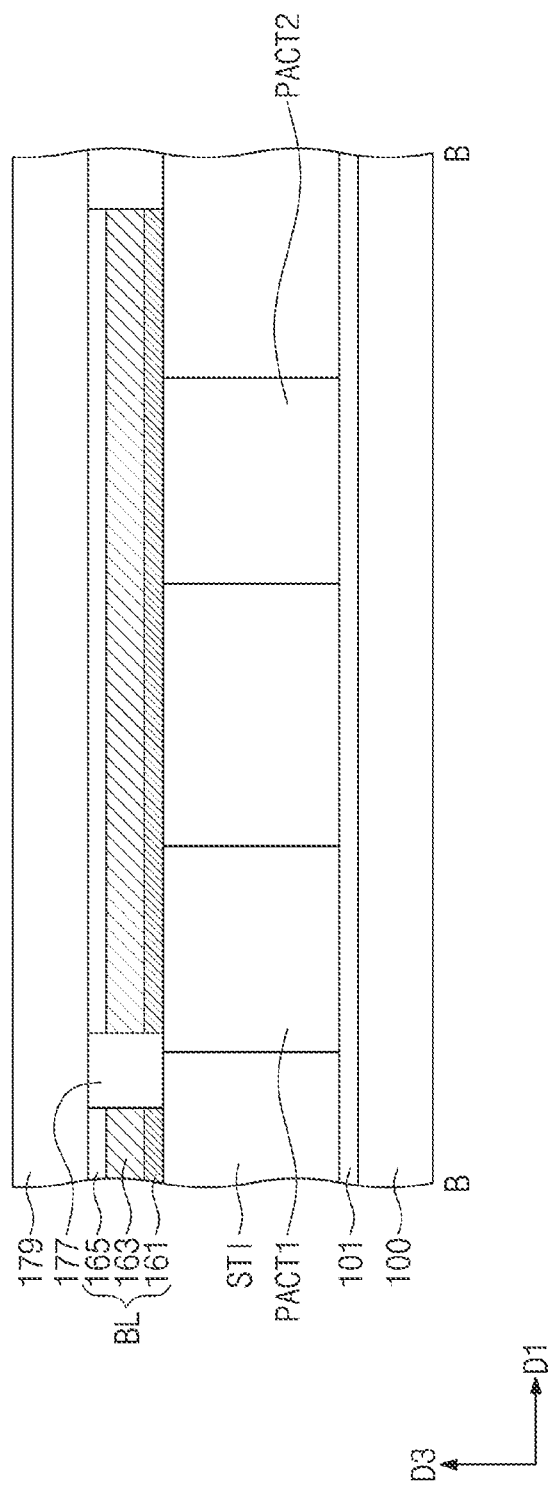

Referring to FIGS. 5, 8, and 9, isolation patterns 177 may be selectively formed to cover a sidewall of the bit line BL (S40). A mask pattern may be provided on the bit line BL. The bit line BL may be anisotropically etched using the mask pattern as an etch mask. Accordingly, trenches extending in a second direction may be formed. The trenches may expose the upper surfaces of the device isolation layer STI and the peripheral active region PACT1. The isolation patterns 177 filling the trenches may be formed using a SOG technique.

Additionally, an insulating layer 179 may be formed on the isolation patterns 177 and the bit line BL (S40). Here, the insulating layer 179 may be deposited to have a uniform thickness. The insulating layer 179 may be formed by using at least one of physical vapor deposition (PVD), thermal chemical vapor deposition (thermal CVD), low pressure chemical vapor deposition (LP-CVD), plasma enhanced chemical vapor deposition (PE-CVD), or atomic layer deposition (ALD) techniques.

Figure 10:
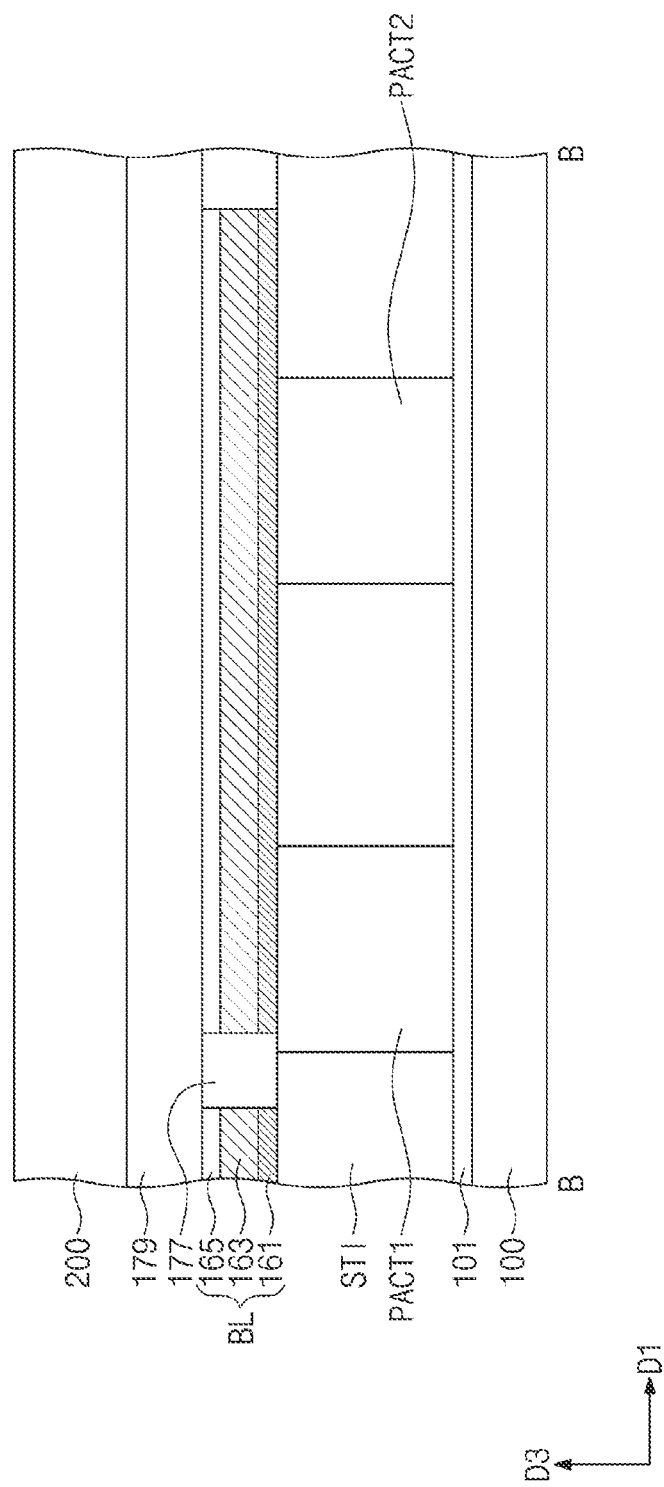

Referring FIGS. 5 and 10, a second substrate 200 may be provided on the insulating layer 179 and bonded thereto. Here, the second substrate 200 may correspond to the substrate 200 of FIGS. 2 and 3A, 3B and 3C. After bonding the second substrate 200, a rear lapping process for removing the first substrate 100 may be performed (S50). Removal of the first substrate 100 may include sequentially performing a grinding process and a wet etching process to expose the device isolation layer STI and the peripheral active regions PACT1 and PACT2. Alternately, the buried insulating layer 101 may be exposed.

Figure 11:
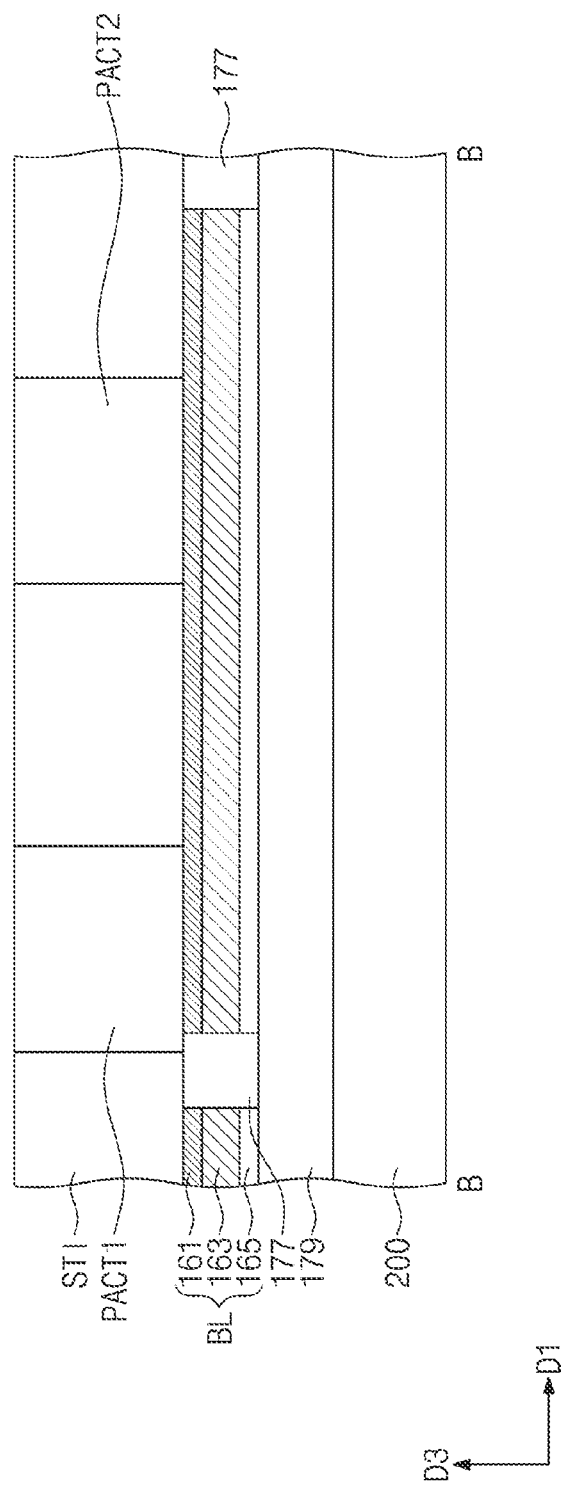

Referring to FIGS. 5 and 11, after bonding the second substrate 200, the bonded substrates 100 and 200 may be inverted (S50). That is, the second substrate 200 may be inverted such that the second substrate 200 is disposed under the first substrate 100. After the bonded substrates 100 and 200 are inverted, removal of the first substrate 100 and the buried insulating layer 101 may be performed. As a result, upper surfaces of the device isolation layer STI and the peripheral active regions PACT1 and PACT2 may be exposed.

Figure 12:
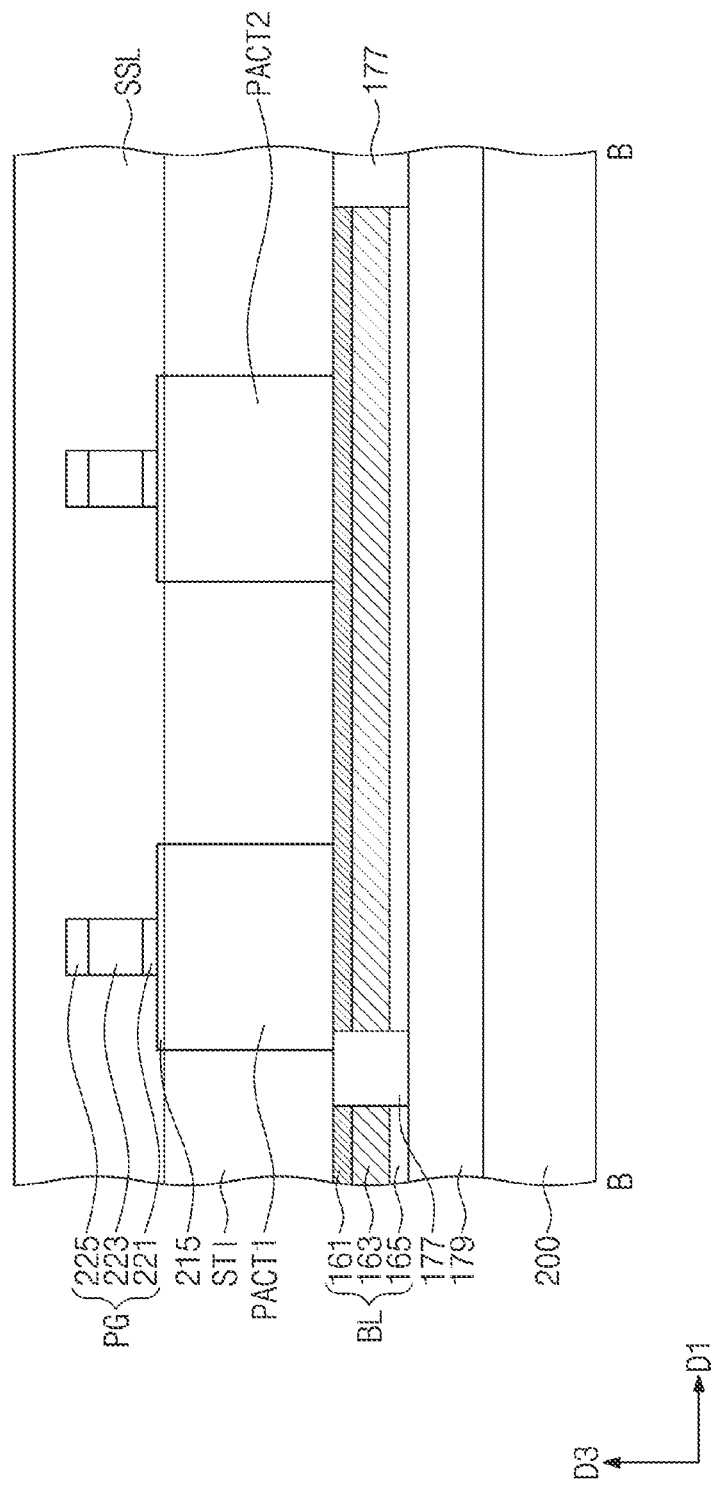

Referring to FIGS. 5 and 12, a Core/Peri transistor may be formed on the upper surfaces of the peripheral active regions PACT1 and PACT2 (S60). That is, peripheral gate insulating layers 215 covering the upper surfaces of the peripheral active regions PACT1 and PACT2 may be formed, and peripheral gate electrodes PG may be formed on the peripheral gate insulating layer 215. The peripheral gate electrodes PG may include a peripheral conductive pattern 221, a peripheral metal pattern 223, and a peripheral mask pattern 225 that are sequentially stacked. Thereafter, a peripheral insulating layer SSL may be formed to cover the peripheral gate insulating layers 215, the peripheral gate electrodes PG, and the device isolation layer STI.

Figure 13:
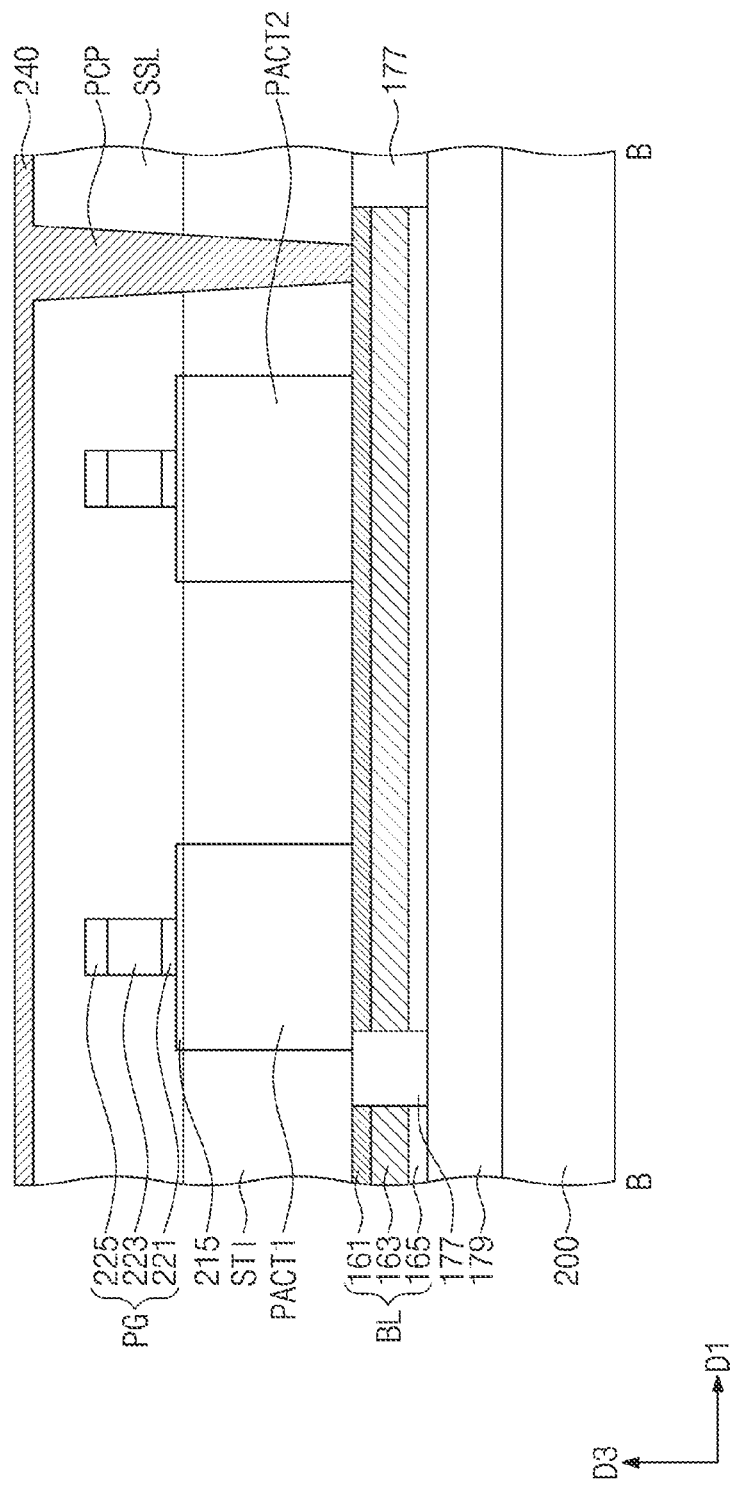

Referring to FIGS. 5 and 13, a contact pattern PCP connecting the bit line BL through the peripheral insulating layer SSL and the device isolation layer STI may be formed (S70). The forming of the contact pattern PCP may include patterning the peripheral insulating layer SSL and the device isolation layer STI to form a hole exposing the bit line BL, and depositing a conductive layer 240 filling the hole, and planarizing the conductive layer 240.

Figure 14:
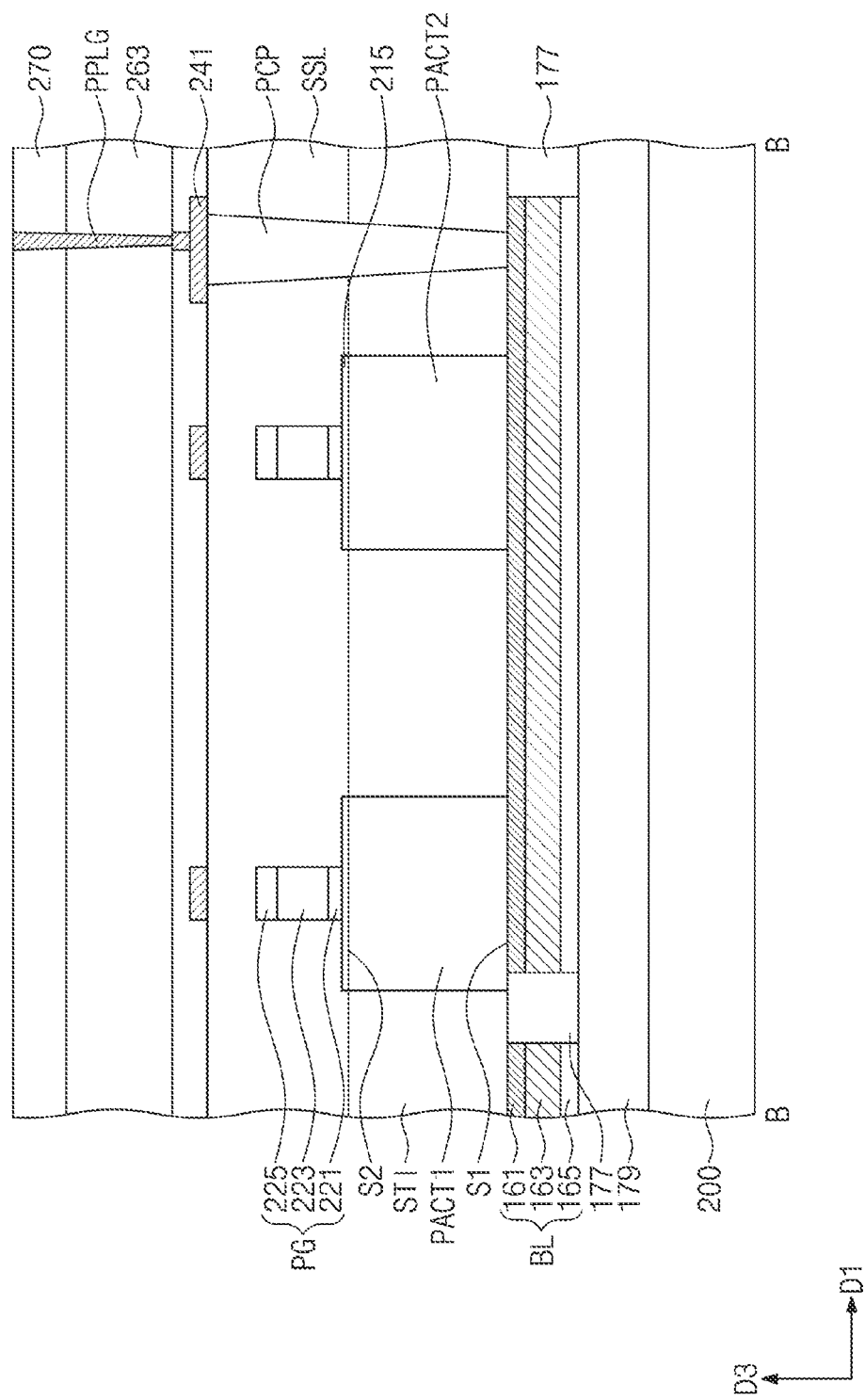

Referring to FIGS. 5 and 14, a contact plug PPLG may be formed through a peripheral circuit insulating layer 263 and the upper insulating layer 270 (S80). The forming of the contact plug PPLG may include patterning the conductive layer 240 to form a peripheral wiring 241, patterning the peripheral circuit insulating layer 263 and the upper insulating layer 270 to form a hole exposing the peripheral wiring 241, depositing a hole-filling contact plug PPLG, and planarizing the upper insulating layer 270.

From the foregoing those skilled in the art will appreciate that within various embodiments of the inventive concept, active regions of a semiconductor memory device will not be connected to the substrate (sub-Si), thereby improving the electrical characteristics of the semiconductor memory device. As the active regions are not connected to the substrate, no depletion region is developed due to the P/N junction, and leakage current due to the depletion region is inhibited. Accordingly, semiconductor memory devices according to embodiments of the inventive concept provide overall improved reliability and better electrical performance characteristics.

The active regions of the semiconductor memory device may be formed on the insulating layer to be the floating state, and the bit lines buried in the insulating layer may be used as the wirings of the active regions. Different well biases may be applied to the cell array region and the peripheral circuit region (Core/Peri) through the buried bit lines, respectively. By applying the different biases to each region in the semiconductor memory device, switching function of transistor(s) and overall electrical characteristics of the device may be improved.

While certain embodiments of the inventive concepts have been particularly shown and described, it will be understood by one of ordinary skill in the art that variations in form and detail may be made therein without departing from the scope of the inventive concept as defined by the following claims.

What is claimed is:

1. A semiconductor memory device comprising:
a substrate including a cell array region and a peripheral circuit region;
an insulating layer provided on the peripheral circuit region of the substrate;
a bit line provided on the insulating layer and extending in a first direction;
an isolation pattern provided on the insulating layer and covering a sidewall of the bit line;
a first peripheral active region and a second peripheral active region disposed on the bit line and spaced apart by a device isolation layer;
a first peripheral gate electrode and a second peripheral gate electrode respectively provided on the first peripheral active region and the second peripheral active region; and
a contact pattern connected to the bit line, wherein at least one of the first peripheral active region and the second peripheral active region is connected to the bit line, and each of the first peripheral active region and the second peripheral active region has an island shape and is not connected to the substrate by the isolation layer, the isolation pattern, and the insulating layer.

2. The semiconductor memory device of claim 1, further comprising:
a first bit line and a second bit line respectively corresponding to the first peripheral active region and the second peripheral active region; and
a first contact pattern and a second contact pattern respectively contacting upper surfaces of the first bit line and the second bit line,
wherein a first variable voltage is applied to the first contact pattern and a second variable voltage is applied to the second contact pattern, and
different well biases are respectively applied to the first peripheral active region and the second peripheral active region in accordance with the first variable voltage and the second variable voltage.

3. The semiconductor memory device of claim 1, wherein each of the insulating layer and the isolation pattern includes at least one of silicon nitride (SiN), silicon oxide (SiOx), silicon oxynitride (SiON), silicon carbide (SiC), and silicon carbon nitride (SiCN).

4. The semiconductor memory device of claim 3, wherein the insulating layer and the isolation pattern include a same material.

5. The semiconductor memory device of claim 1, further comprising:
a first connection pattern and a second connection pattern provided between the bit line and the first peripheral region and the second peripheral active region.

6. The semiconductor memory device of claim 5, wherein the bit line includes a sequentially stacked combination of a hard mask pattern, a metal pattern, and a polysilicon pattern, and
each of the first connection pattern, the second connection pattern and the polysilicon pattern include a same material.

7. The semiconductor memory device of claim 5, wherein each of the first connection pattern and the second connection patterns includes at least one of titanium nitride, tantalum nitride, tungsten, titanium, and tantalum.

8. The semiconductor memory device of claim 1, further comprising:
a first metal silicide pattern and a second metal silicide pattern disposed between the bit line and the first peripheral active region and the second peripheral active region.

9. The semiconductor memory device of claim 8, further comprising:
a first connection pattern and a second connection pattern provided between the bit line and the first metal silicide pattern and the second metal silicide pattern.

10. The semiconductor memory device of claim 1, wherein each of the first peripheral active region and the second peripheral active region include a single crystal semiconductor material.

11. The semiconductor memory device of claim 1, wherein the bit line has a plate shape.

12. A semiconductor memory device comprising:
a substrate and an insulating layer provided on the substrate;
a first peripheral active region and a second peripheral active region on the insulating layer, each of the first peripheral active region and second peripheral active region having a first surface and an opposing second surface;
a device isolation layer interposed between the first peripheral active region and the second peripheral active region to isolate the first peripheral active region and the second peripheral active region;
a bit line connected to at least one of the first surface of the first peripheral active region and the first surface of the second peripheral active region;
a first gate insulating layer provided on the second surface of the first peripheral active region and a second gate insulating layer provided on the second surface of the second peripheral active region;
a first peripheral gate electrode disposed on the first gate insulating layer and a second peripheral gate electrode disposed on the second gate insulating layer; and
a contact pattern connected to the bit line,
wherein each of the first peripheral active region and the second peripheral active region is floated in relation to the substrate by the insulating layer.

13. The semiconductor memory device of claim 12, further comprising:
a first bit line corresponding to the first surface of the first peripheral active region and a second bit line corresponding to the second peripheral active region; and
a first contact pattern contacting an upper surface of the first bit line and a second contact pattern contacting an upper surface of the second bit line,
wherein a first variable voltage and a second variable voltage are applied to each of the first contact pattern and the second contact pattern, and
different well biases are applied to each of the first peripheral active region and the second peripheral active region by the first variable voltage and the second variable voltage.

14. The semiconductor memory device of claim 12, wherein the bit line includes a hard mask pattern, a metal pattern, and a polysilicon pattern, and further comprising:
connection patterns provided between the polysilicon pattern and an upper surface of the first peripheral active region and an upper surface of the second peripheral active region.

15. The semiconductor memory device of claim 14, wherein the connection patterns include at least one of polysilicon, titanium nitride, tantalum nitride, tungsten, titanium, and tantalum.

16. The semiconductor memory device of claim 14, wherein the contact pattern contacts the polysilicon pattern, and
a lower surface of the contact pattern is lower than the upper surface of the first peripheral active region and the upper surface of the second peripheral active region.

17. The semiconductor memory device of claim 12, wherein each of the first peripheral active region and the second peripheral active region includes a single crystal semiconductor material.

* * * * *